United States Patent
Kumar et al.

(10) Patent No.: US 7,214,280 B2
(45) Date of Patent: May 8, 2007

(54) PLASMA-ASSISTED DECRYSTALLIZATION

(75) Inventors: Devendra Kumar, Rochester Hills, MI (US); Satyendra Kumar, Troy, MI (US)

(73) Assignee: BTU International Inc., N. Billerica, MA (US)

( * ) Notice: Subject to any disclaimer, the term of this patent is extended or adjusted under 35 U.S.C. 154(b) by 341 days.

(21) Appl. No.: 10/430,416

(22) Filed: May 7, 2003

(65) Prior Publication Data
US 2004/0107896 A1 Jun. 10, 2004

Related U.S. Application Data

(60) Provisional application No. 60/435,278, filed on Dec. 23, 2002, provisional application No. 60/430,677, filed on Dec. 4, 2002, provisional application No. 60/378,693, filed on May 8, 2002.

(51) Int. Cl.
C22F 3/00 (2006.01)
(52) U.S. Cl. .................. 148/525; 148/565; 204/157.44
(58) Field of Classification Search ............... 148/525, 148/565; 204/157.44
See application file for complete search history.

(56) References Cited

U.S. PATENT DOCUMENTS

| | | | |
|---|---|---|---|
| 3,432,296 A | 3/1969 | McKinnon et al. | |
| 3,612,686 A | 10/1971 | Braman et al. | |
| 3,731,047 A | 5/1973 | Mullen et al. | |
| 4,004,934 A | 1/1977 | Prochazka | |
| 4,025,818 A | 5/1977 | Giguere et al. | |
| 4,090,055 A | 5/1978 | King | |
| 4,147,911 A | 4/1979 | Nishitani | |
| 4,151,034 A | 4/1979 | Yamamoto et al. | |
| 4,213,818 A | 7/1980 | Lemons et al. | |
| 4,230,448 A | 10/1980 | Ward et al. | |
| 4,265,730 A | 5/1981 | Hirose et al. | |
| 4,307,277 A | 12/1981 | Maeda et al. | |
| 4,339,326 A | 7/1982 | Hirose et al. | |
| 4,404,456 A | 9/1983 | Cann | |

(Continued)

FOREIGN PATENT DOCUMENTS

DE 222 348 A1 5/1985

(Continued)

OTHER PUBLICATIONS

Roy, R., et al., "Definitive Experimental Evidence for Microwave Effects: Radically New Effects of Separated E and H Fields, Such As Decrystallization of Oxides in Seconds," Material Research Innovations, Springer-Verlag, 6(3) (2002), pp. 128-140.

(Continued)

Primary Examiner—George Wyszomierski
(74) Attorney, Agent, or Firm—Weingarten, Schurgin, Gagnebin & Lebovici LLP

(57) ABSTRACT

Methods and apparatus are provided for igniting, modulating, and sustaining a plasma for at least partially decrystallizing a surface of an object. In one embodiment, a method is provided for decrystallizing a surface of an object by forming a plasma (such as by subjecting a gas to an amount of electromagnetic radiation, optionally in the presence of a plasma catalyst) and exposing the surface of the object to the plasma.

29 Claims, 10 Drawing Sheets

U.S. PATENT DOCUMENTS

| | | | |
|---|---|---|---|
| 4,473,736 A | 9/1984 | Bloyet et al. | |
| 4,479,075 A | 10/1984 | Elliott | |
| 4,500,564 A | 2/1985 | Enomoto | |
| 4,504,007 A | 3/1985 | Anderson, Jr. et al. | |
| 4,609,808 A | 9/1986 | Bloyet et al. | |
| 4,611,108 A | 9/1986 | Leprince et al. | |
| 4,624,738 A | 11/1986 | Westfall et al. | |
| 4,666,775 A | 5/1987 | Kim et al. | |
| 4,687,560 A | 8/1987 | Tracy | |
| 4,698,234 A | 10/1987 | Ovshinsky | |
| 4,760,230 A | 7/1988 | Hassler | |
| 4,767,902 A | 8/1988 | Palaith et al. | |
| 4,772,770 A | 9/1988 | Matsui et al. | |
| 4,792,348 A | 12/1988 | Pekarsky | |
| 4,840,139 A | 6/1989 | Takei | |
| 4,871,581 A | 10/1989 | Yamazaki | |
| 4,877,589 A | 10/1989 | O'Hare | |
| 4,877,938 A | 10/1989 | Rau et al. | |
| 4,883,570 A | 11/1989 | Efthimion et al. | |
| 4,888,088 A | 12/1989 | Slomowitz | |
| 4,891,488 A | 1/1990 | Davis et al. | |
| 4,893,584 A | 1/1990 | Doehler et al. | |
| 4,908,492 A | 3/1990 | Okamoto et al. | |
| 4,919,077 A | 4/1990 | Oda et al. | |
| 4,924,061 A | 5/1990 | Labat et al. | |
| 4,946,547 A | 8/1990 | Palmour et al. | |
| 4,956,590 A | 9/1990 | Phillips | |
| 4,963,709 A | 10/1990 | Kimrey, Jr. | |
| 4,972,799 A | 11/1990 | Misumi et al. | |
| 5,003,152 A | 3/1991 | Matsuo | |
| 5,010,220 A | 4/1991 | Apte et al. | |
| 5,015,349 A | 5/1991 | Suib et al. | |
| 5,017,404 A | 5/1991 | Paquet et al. | |
| 5,023,056 A | 6/1991 | Aklufi et al. | |
| 5,058,527 A | 10/1991 | Ohta et al. | |
| 5,072,650 A | 12/1991 | Phillips | |
| 5,074,112 A | 12/1991 | Walton et al. | |
| 5,085,885 A | 2/1992 | Foley et al. | |
| 5,087,272 A | 2/1992 | Nixdorf | |
| 5,103,715 A | 4/1992 | Phillips | |
| 5,120,567 A | 6/1992 | Frind et al. | |
| 5,122,633 A | 6/1992 | Moshammer et al. | |
| 5,131,993 A | 7/1992 | Suib et al. | |
| 5,164,130 A | 11/1992 | Holcombe et al. | |
| 5,202,541 A | 4/1993 | Patterson et al. | |
| 5,222,448 A | 6/1993 | Morgenthaler et al. | |
| 5,223,308 A | 6/1993 | Doehler | |
| 5,224,117 A | 6/1993 | Kruger et al. | |
| 5,227,695 A | 7/1993 | Pelletier et al. | |
| 5,271,963 A | 12/1993 | Eichman et al. | |
| 5,276,297 A | 1/1994 | Nara | |
| 5,276,386 A | 1/1994 | Watanabe et al. | |
| 5,277,773 A | 1/1994 | Murphy | |
| 5,284,544 A | 2/1994 | Mizutani et al. | |
| 5,304,766 A | 4/1994 | Baudet et al. | |
| 5,307,892 A | 5/1994 | Phillips | |
| 5,310,426 A | 5/1994 | Mori | |
| 5,311,906 A | 5/1994 | Phillips | |
| 5,316,043 A | 5/1994 | Phillips | |
| 5,321,223 A | 6/1994 | Kimrey, Jr. et al. | |
| 5,349,154 A | 9/1994 | Harker et al. | |
| 5,366,764 A | 11/1994 | Sunthankar | |
| 5,370,525 A | 12/1994 | Gordon | |
| 5,423,180 A | 6/1995 | Nobue et al. | |
| 5,435,698 A | 7/1995 | Phillips | |
| 5,449,887 A | 9/1995 | Holcombe et al. | |
| 5,487,811 A * | 1/1996 | Iizuka | 438/714 |
| 5,505,275 A | 4/1996 | Phillips | |
| 5,514,217 A | 5/1996 | Niino et al. | |
| 5,520,740 A | 5/1996 | Kanai et al. | |
| 5,521,360 A | 5/1996 | Johnson et al. | |
| 5,523,126 A | 6/1996 | Sano et al. | |
| 5,527,391 A | 6/1996 | Echizen et al. | |
| 5,536,477 A | 7/1996 | Cha et al. | |
| 5,597,456 A | 1/1997 | Maruyama et al. | |
| 5,607,509 A | 3/1997 | Schumacher et al. | |
| 5,616,373 A | 4/1997 | Karner et al. | |
| 5,637,180 A * | 6/1997 | Gosain et al. | 156/345.47 |
| 5,645,897 A | 7/1997 | Andra | |
| 5,651,825 A | 7/1997 | Nakahigashi et al. | |
| 5,662,965 A | 9/1997 | Deguchi et al. | |
| 5,670,065 A | 9/1997 | Bickmann et al. | |
| 5,671,045 A | 9/1997 | Woskov et al. | |
| 5,682,745 A | 11/1997 | Phillips | |
| 5,688,477 A * | 11/1997 | Nel | 423/82 |
| 5,689,949 A | 11/1997 | DeFreitas et al. | |
| 5,712,000 A | 1/1998 | Wei et al. | |
| 5,714,010 A | 2/1998 | Matsuyama et al. | |
| 5,715,677 A | 2/1998 | Wallman et al. | |
| 5,734,501 A | 3/1998 | Smith | |
| 5,735,451 A | 4/1998 | Mori et al. | |
| 5,741,364 A | 4/1998 | Kodama et al. | |
| 5,755,097 A | 5/1998 | Phillips | |
| 5,794,113 A | 8/1998 | Munir et al. | |
| 5,796,080 A | 8/1998 | Jennings et al. | |
| 5,808,282 A | 9/1998 | Apte et al. | |
| 5,828,338 A | 10/1998 | Gerstenberg | |
| 5,841,237 A | 11/1998 | Alton | |
| 5,847,355 A | 12/1998 | Barmatz et al. | |
| 5,848,348 A | 12/1998 | Dennis | |
| 5,859,404 A | 1/1999 | Wei et al. | |
| 5,868,871 A | 2/1999 | Yokose et al. | |
| 5,874,705 A | 2/1999 | Duan | |
| 5,904,993 A | 5/1999 | Takeuchi et al. | |
| 5,939,026 A | 8/1999 | Seki et al. | |
| 5,945,351 A | 8/1999 | Mathuni | |
| 5,961,773 A | 10/1999 | Ichimura et al. | |
| 5,961,871 A | 10/1999 | Bible et al. | |
| 5,973,289 A | 10/1999 | Read et al. | |
| 5,976,429 A | 11/1999 | Chen et al. | |
| 5,980,843 A | 11/1999 | Silversand | |
| 5,980,999 A | 11/1999 | Goto et al. | |
| 5,989,477 A | 11/1999 | Berger | |
| 5,993,612 A | 11/1999 | Rostaing et al. | |
| 5,998,774 A | 12/1999 | Joines et al. | |
| 6,011,248 A | 1/2000 | Dennis | |
| 6,028,393 A | 2/2000 | Izu et al. | |
| 6,038,854 A | 3/2000 | Penetrante et al. | |
| 6,039,834 A * | 3/2000 | Tanaka et al. | 156/345.36 |
| 6,054,693 A | 4/2000 | Barmatz et al. | |
| 6,054,700 A | 4/2000 | Rokhvarger et al. | |
| 6,096,389 A | 8/2000 | Kanai | |
| 6,101,969 A | 8/2000 | Niori et al. | |
| 6,103,068 A | 8/2000 | Merten et al. | |
| 6,121,109 A * | 9/2000 | Chen et al. | 438/396 |
| 6,122,912 A | 9/2000 | Phillips | |
| 6,131,386 A | 10/2000 | Trumble | |
| 6,132,550 A | 10/2000 | Shiomi | |
| 6,139,656 A * | 10/2000 | Wilkosz et al. | 148/512 |
| 6,149,985 A | 11/2000 | Grace et al. | |
| 6,152,254 A | 11/2000 | Phillips | |
| 6,153,868 A | 11/2000 | Marzat | |
| 6,183,689 B1 | 2/2001 | Roy et al. | |
| 6,186,090 B1 | 2/2001 | Dotter, II et al. | |
| 6,189,482 B1 | 2/2001 | Zhao et al. | |
| 6,204,190 B1 * | 3/2001 | Koshido | 438/712 |
| 6,204,606 B1 | 3/2001 | Spence et al. | |
| 6,224,836 B1 | 5/2001 | Moisan et al. | |
| 6,228,773 B1 | 5/2001 | Cox | |
| 6,238,629 B1 | 5/2001 | Barankova et al. | |
| 6,248,206 B1 | 6/2001 | Herchen et al. | |
| 6,264,812 B1 | 7/2001 | Raaijmakers et al. | |
| 6,284,202 B1 | 9/2001 | Cha et al. | |
| 6,287,980 B1 | 9/2001 | Hanazaki et al. | |

| | | | | | | |
|---|---|---|---|---|---|---|
| 6,287,988 | B1 | 9/2001 | Nagamine et al. | JP | 08-217558 A | 8/1996 |
| 6,297,172 | B1 | 10/2001 | Kashiwagi | JP | 08-281423 A | 10/1996 |
| 6,297,595 | B1 | 10/2001 | Stimson et al. | JP | 09-017597 A | 1/1997 |
| 6,329,628 | B1 | 12/2001 | Kuo et al. | JP | 09-023458 A | 1/1997 |
| 6,342,195 | B1 | 1/2002 | Roy et al. | JP | 09-027459 A | 1/1997 |
| 6,345,497 | B1 | 2/2002 | Penetrante | JP | 09-027482 A | 1/1997 |
| 6,348,158 | B1 | 2/2002 | Samukawa .................. 216/67 | JP | 09-078240 A | 3/1997 |
| 6,358,361 | B1 | 3/2002 | Matsumoto | JP | 09-102400 A | 4/1997 |
| 6,362,449 | B1 | 3/2002 | Hadidi et al. | JP | 09-102488 A | 4/1997 |
| 6,365,885 | B1 | 4/2002 | Roy et al. | JP | 09-111461 A | 4/1997 |
| 6,367,412 | B1 | 4/2002 | Ramaswamy et al. | JP | 09-137274 A | 5/1997 |
| 6,370,459 | B1 | 4/2002 | Phillips | JP | 09-157048 A | 6/1997 |
| 6,372,304 | B1 | 4/2002 | Sano et al. | JP | 09-223596 A | 8/1997 |
| 6,376,027 | B1 | 4/2002 | Lee et al. | JP | 09-235686 A | 9/1997 |
| 6,383,333 | B1 | 5/2002 | Haino et al. | JP | 09-251971 A | 9/1997 |
| 6,383,576 | B1 | 5/2002 | Matsuyama | JP | 09-295900 A | 11/1997 |
| 6,388,225 | B1 | 5/2002 | Blum et al. | JP | 10-066948 A | 3/1998 |
| 6,392,350 | B1 | 5/2002 | Amano | JP | 10-081588 A | 3/1998 |
| 6,407,359 | B1 | 6/2002 | Lagarde et al. | JP | 10-081970 A | 3/1998 |
| 6,488,112 | B1 | 12/2002 | Kleist | JP | 10-087310 A | 4/1998 |
| 6,512,216 | B2 | 1/2003 | Gedevanishvili et al. | JP | 10-204641 A | 8/1998 |
| 6,522,055 | B2 | 2/2003 | Uemura et al. | JP | 10-259420 A | 9/1998 |
| 6,575,264 | B2 | 6/2003 | Spadafora | JP | 10-294306 A | 11/1998 |
| 6,592,664 | B1 | 7/2003 | Frey et al. | JP | 11-031599 A | 2/1999 |
| 6,610,611 | B2 | 8/2003 | Liu et al. | JP | 11-106947 A | 4/1999 |
| 6,712,298 | B2 | 3/2004 | Kohlberg et al. | JP | 11-145116 A | 5/1999 |
| 6,717,368 | B1 | 4/2004 | Sakamoto et al. | JP | 11-186222 A | 7/1999 |
| 6,870,124 | B2 | 3/2005 | Kumar et al. | JP | 11-228290 A | 8/1999 |
| 2001/0027023 | A1 | 10/2001 | Ishihara et al. | JP | 11-265885 A | 9/1999 |
| 2001/0028919 | A1 | 10/2001 | Liu et al. | JP | 11-273895 A | 10/1999 |
| 2002/0034461 | A1 | 3/2002 | Segal | JP | 11-297266 A | 10/1999 |
| 2002/0036187 | A1 | 3/2002 | Ishll et al. | JP | 2000-012526 A | 1/2000 |
| 2002/0100751 | A1 | 8/2002 | Carr | JP | 2000-173989 A | 6/2000 |
| 2002/0124867 | A1 | 9/2002 | Kim et al. | JP | 2000-203990 A | 7/2000 |
| 2002/0135308 | A1 | 9/2002 | Janos et al. | JP | 2000-269182 A | 9/2000 |
| 2002/0140381 | A1 | 10/2002 | Golkowski et al. | JP | 2000-288382 A | 10/2000 |
| 2002/0190061 | A1 | 12/2002 | Gerdes et al. | JP | 2000-306901 A | 11/2000 |
| 2002/0197882 | A1 | 12/2002 | Niimi et al. | JP | 2000-310874 A | 11/2000 |
| 2003/0071037 | A1 | 4/2003 | Sato et al. | JP | 2000-310876 A | 11/2000 |
| 2003/0111334 | A1 | 6/2003 | Dodelet et al. | JP | 2000-317303 A | 11/2000 |
| 2003/0111462 | A1 | 6/2003 | Sato et al. | JP | 2000-323463 A | 11/2000 |
| 2004/0001295 | A1 | 1/2004 | Kumar et al. | JP | 2000-348897 A | 12/2000 |
| 2004/0004062 | A1 | 1/2004 | Kumar et al. | JP | 2001-013719 A | 1/2001 |
| 2004/0070347 | A1 | 4/2004 | Nishida et al. | JP | 2001-053069 A | 2/2001 |
| 2004/0089631 | A1 | 5/2004 | Blalock et al. | JP | 2001-058127 A | 3/2001 |
| 2004/0107796 | A1 | 6/2004 | Kumar et al. | JP | 2001-093871 A | 4/2001 |
| 2004/0107896 | A1 | 6/2004 | Kumar et al. | JP | 2001-149754 A | 6/2001 |
| 2004/0118816 | A1 | 6/2004 | Kumar et al. | JP | 2001-149918 A | 6/2001 |
| | | | | JP | 2001-196420 A | 7/2001 |
| | | FOREIGN PATENT DOCUMENTS | | JP | 2001-303252 A | 10/2001 |
| | | | | JP | 2001-332532 A | 11/2001 |
| DE | | 195 42 352 A1 | 5/1997 | JP | 2001-351915 A | 12/2001 |
| DE | | 100 05 146 A1 | 8/2001 | JP | 2002-022135 A | 1/2002 |
| EP | | 0 335 675 A2 | 10/1989 | JP | 2002-028487 A | 1/2002 |
| EP | | 0 228 864 B1 | 3/1991 | JP | 2002-069643 A | 3/2002 |
| EP | | 0 420 101 A2 | 4/1991 | JP | 2002-075960 A | 3/2002 |
| EP | | 0 435 591 A | 7/1991 | JP | 2002-126502 A | 5/2002 |
| EP | | 0 435 591 A2 | 7/1991 | JP | 2002-273161 A | 9/2002 |
| EP | | 0 436 361 A1 | 7/1991 | JP | 2002-273168 A | 9/2002 |
| EP | | 0 520 719 B1 | 5/1996 | JP | 2003-075070 A | 3/2003 |
| EP | | 0 670 666 B1 | 6/1998 | JP | 2003-264057 A | 9/2003 |
| EP | | 0 724 720 B1 | 5/2000 | WO | WO 95-11442 A1 | 4/1995 |
| EP | | 1 093 846 A1 | 4/2001 | WO | WO 96-06700 A1 | 3/1996 |
| EP | | 1 427 265 A2 | 6/2004 | WO | WO 96-38311 A1 | 12/1996 |
| JP | | 56-140021 A2 | 11/1981 | WO | WO 97-13141 A1 | 4/1997 |
| JP | | 57-119164 A2 | 7/1982 | WO | WO 01-55487 A2 | 8/2001 |
| JP | | 58-025073 A | 2/1983 | WO | WO 01-58223 | 8/2001 |
| JP | | 59-103348 * | 6/1984 | WO | WO 01-82332 A1 | 11/2001 |
| JP | | 59-169053 A | 9/1984 | WO | WO 02-26005 A1 | 3/2002 |
| JP | | 62-000535 A | 1/1987 | WO | WO 02-061165 A1 | 8/2002 |
| JP | | 04-74858 A | 3/1992 | WO | WO 02-061171 A1 | 8/2002 |
| JP | | 06-345541 A | 12/1994 | WO | WO 02-062114 A1 | 8/2002 |
| JP | | 07-153405 A | 6/1995 | WO | WO 02-062115 A1 | 8/2002 |

| | | |
|---|---|---|
| WO | WO 02-067285 A2 | 8/2002 |
| WO | WO 02-067285 A3 | 8/2002 |
| WO | WO 03-018862 A2 | 3/2003 |
| WO | WO 03-018862 A3 | 3/2003 |
| WO | WO 03-028081 A2 | 4/2003 |
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 2004-050939 A2 | 6/2004 |

OTHER PUBLICATIONS

Roy R et al. "Major phase transformations and magnetic property changescaused by electromagnetic fields at microwave frequencies" Journal of Material Research, Dec. 2002, Mater. Res. Soc, USA, vol. 17, No. 12, pp. 3008-3011.
Takizawa et al. "Synthesis of inorganic materials by 28 GHz MW radiation" Proceed. of the Symposium on MW Effects and Applications. Aug. 2, 2001 Kokushikau Univ., Tokyo, Japan, pp. 52-53.
Letter from Chinese Associate enclosing office action in CN Appl. No. 03810271.4, dated Dec. 27, 2005.
Preliminary Amendment filed Jul. 15, 2005 in U.S. Appl. No. 11/182,172.
Specification and Claims as filed in PCT/US05/39642 on Nov. 1, 2005.
Accentus Corporate Overview, 3 pages—http://www.accentus.co.uk/ipco/techenv6$_{13}$txt_fr.html (2003).
Agrawal et al., "Grain Growth Control in Microwave Sintering of Ultrafine WC-Co Composite Powder Compacts," Euro PM99 Conference, Sintering, Turino, Italy, 8 pages (1999).
Agrawal, "Metal Parts from Microwaves," *Materials World* 7(11):672-673 (1999).
Agrawal et al., "Microwave Sintering of Commercial WC/Co Based Hard Metal Tools," Euro PM99 Conference, Sintering, Turino, Italy, 8 pages (1999).
Agrawal, "Microwave Processing of Ceramics," *Current Opinion in Solid State and Materials Science* 3:480-485 (Oct. 1998).
Air Liquide, "Heat Treatment—Gas Quenching,"—http://www.airliquide.com/en/business/industry/metals/applications/heat_treatment/quenching.asp, 1 page (2000).
Alexander et al., "Electrically Conductive Polymer Nanocomposite Materials," AFRL's Materials and Manufacturing Directorate, Nonmetallic Materials Division, Polymer Branch, Wright-Patterson AFB OH—http://www.afrlhorizons.com/Briefs/Sept02/ML0206.html, 2 pages. (Sep. 2002).
Al-Shamma'a et al., "Microwave Atmospheric Plasma for Cleaning Exhaust Gases and Particulates," Future Car Congress, Washington, Jun. 3-5, 2002 (1 page).
Alton et al., "A High-Density, RF Plasma-Sputter Negative Ion Source," The 8$^{th}$ Intl. Conf. on Heavy-Ion Accelerator Technology, Argonne Natl. Lab., Oct. 5-9, 1998, Poster Presentation (3 pages).
Anklekar et al., "Microwave Sintering and Mechanical Properties of PM Copper Steel," *Powder Metallurgy* 44(4):355-362 (2001).

Batanov et al., "Plasmachemical Deposition of Thin Films in a Localized Free-Space Microwave Discharge," *Technical Physics* 38(6):475-479 (Jun. 1993).
"Carbonitriding," Treat All Metals, Inc., 2 pages—http://www.treatallmetals.com/carbon.htm.
"Carburizing," Treat All Metals, Inc.—http://www.treatallmetals.com/gas.htm, 2 pages.
Cheng, J., "Fabricating Transparent Ceramics by Microwave Sintering," *Am. Ceramic Soc. Bull*. 79(9):71-74 (2000).
Cheng et al., "Microwave Processing of WC-Co Composites And Ferroic Titanates" *Mat. Res. Innovat*. 1(1):44-52 (Jun. 1997).
Circle Group Holdings, Inc., "StarTech Environmental Corp."—http://www.crgq.com/cgiweb/HTML/eMentor_Companies/startech.html, 9 pages.
"Classification of Cast Iron"—Key to Steel—Article—http://www.key-to-steel.com/Articles/Art63.htm, 3 pages (1999).
Collin, in: *Foundations for Microwave Engineering*, 2d Ed., IEEE Press, NY, pp. 180-192 (2001).
"Controlled Atmospheres Sinter-Hardening,," Sarnes Ingenieure, 2 pages, http://www.space-ctrl.de/de/2002/06/399.php (2002).
Egashira et al., "Decomposition of Trichloroethylene by Microwave-Induced Plasma Generated from SiC Whiskers," *J. Electrochem. Soc*., 145(1):229-235 (Jan 1998).
Ford 1.3L Catalytic Converter (1988-1989) product description—http://catalyticconverters.com/FO13L43778889.html, 1 page, Undated.
Ford Contour Catalytic Converter (1995-1996) product description—http://www.all-catalytic-converters.com/ford-contour-converter.html, 2 pages, Undated.
Fraunhofer ILT, "Plasma-Reactors for Aftertreatment of Automobile Exhaust Gas," Fraunhofer-Gesellschaft—http://www.ilt.fhg.de/eng/jb01-s35.html, 1 page (2002).
French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.
Gao et al., "Superfast Densification of Oxide/Oxide Ceramic Composites," *J. Am. Ceram. Soc*. 82(4)1061-1063 (1999).
Gedevanishvili et al., "Microwave Combustion Synthesis And Sintering of Intermetallics and Alloys," *J. Mat. Sci. Lett*. 18(9):665-668 (1999).
General Eastern, "Semiconductor Manufacturing—Using the HygroTwin 2850 to Reduce Costs, Improve Quality,", 3 pages, www.generaleastern.net (1997).
George, "The Catalytic Converter," 5 pages, (2002)—http://krioma.net/articles/Catalytic%20Converter/Catalytic%20Converter.htm.
GlassTesseract.Org website, "Tech Procedures and Tips: Exhaust Manifolds and Catalytic Converters Removal—and Installation", 4 pages (2003). http://glasstesseract.org/tech/catalytic.html.
*Hackh's Chemical Dictionary*, 3rd edition, J. Grant, Ed., McGraw Hill Book Co., NY, pp. 174-175 (1944).
"Heat Treatment of Steels—The Processes," AZoM.com, 9 pages, (2002)—www.azom.com.
"Powder Metallurgy—Overview of the Powder Metallurgy Process," AZoM.com, 3 pages (2002)—http://www.azom.com/details.asp?ArticleID=1414.
Honda Automobile News Press Release, "Honda Introduced Its First Two Clean Air Vehicles, the Civic Ferio LEV and Partner 1.6 LEV," 3 pages (Feb. 1997)—http://world.honda.com/news/1997/4970217a.html.
Honda Civic CX Catalytic Converter, (1996-2000) 1 page—http://www.catalyticconverters.com/HOCIVICCX4349600.html, Undated.
"How A Blast Furnace Works—The Blast Furnace Plant," AISI Learning Center, 7 pages. http://www.steel.org/learning/howmade/blast_furnace.htm., Undated.
"How Is Steel Made," Answer Discussion, 6 pages—http://ourworld.compuserve.com/homepages/Dyaros/stlmanuf.htm, Undated.
HSU et al., "Palladium-Coated Kieselguhr for Simultaneous Separataion and Storage of Hydrogen," Westinghouse Savannah River Company, U.S. Dept. of Commerce, National Technical Information Service, 14 pages (2001).

Fincke, "Hydrogen Separation Membrane—Advanced Gas Separation: H2 Separation," Summary of research proposal, 1 page (2003).
"IRC in Materials Processing: Advanced Melting, Atomisation, Powder and Spray Forming, Plasma Melting—Operation of a Plasma Furnace," University of Birmingham website, 3 pages http://www.irc.bham.ac.uk/theme1/plasma/furmace.htm, Undated.
Saville, in: *Iron and Steel*, Chapter 6, pp. 16-22, Wayland Publ., England (1976)..
Japanese Advanced Environment Equipment, "Mitsubishi Graphite Electrode Type Plasma Furnace," 3 pages, Undated—http://nett21. unep.or.jp/JSIM_DATA/WASTE/WASTE_3/html/Doc_467.html.
Johnson, Faculty Biography webpage, Dept. of Materials Science & Engineering, Northwestern University, 2 pages—http://www. matsci.northerwestern.edu/faculty/dlj.html, Undated.
Kalyanaraman et al., "Synthesis and Consolidation of Iron Nanopowders," *NanoStructured Materials* 10(8):1379-1392 (1998).
Karger, Scientific Staff Research Areas for KTP Company, 2 pages (Nov. 2002)—http://wwwfb10.upb.de/KTP/KTP-ENG/Staff/ Karger/body_karger.html.
Kong et al., "Nuclear-Energy-Assisted Plasma Technology for Producing Hydrogen," Nuclear Energy Researcyh Initiative Research Proposal, 4 pages (2002).
Lewis, in: *Hawley's Condensed Chemical Dictionary*, 12th ed., pp. 230-232, Van Nostrand Reinhold, NY (1993).
Lucas, "Welding Using Microwave Power Supplies, " Faculty webpage, 1 page—http://www.liv.ac.uk/EEE/research/cer/project6. htm, Undated.
Luggenholscher et al., "Investigations on Electric Field Distributions in a Microwave Discharge in Hydrogen," Institute fur Laser- und Plasmaphysik, Univsitat Essen, Germany, 4 pages, Undated.
March Plasma Systems, product descriptions,2 pages (2002)—http://www.marchplasma.com/micro_app.htm, Undated.
"Micro-fabricated Palladium-Silver Membrane for Hydrogen Separation and Hydro/Dehydrogenation Reactions," Research Education Group webpage, 5 pages—http://utep.el.utwente.nl/tt/projects/ sepmem/—Undated.
Ahmed et al., "Microwave Joining of Alumina and Zirconia Ceramics," IRIS Research Topics 1998, 1 page (1988).
"Microwave Welding," EWi WeldNet, 1 page—(2003) http://www. ferris.edu/cot/accounts/plastics/ htdocs/Prey/ Microwave%20Homepage.htm.
"Microwave Welding of Plastics," TWI World Centre for Materials Joining Technology, 2 pages, (Aug. 2002)—http://www.twi.co.uk/ j32k/protected/band_3/ksab001.htm.
"Microwave Welding," Welding and Joining Information Network, 3 pages (Nov. 2002)—http://www.ewi.org/technologies/plastics/microwave.asp.
Moss et al., "Experimental Investigation of Hydrogen Transport Through Metals," Experiment Description, Los Alamos National Library, 5 pages—Undated. http://www.education.lanl.gov/RESOURCES/h2/dye/education.html.
"Nitriding," Treat All Metals, Inc., 2 pages—Undated—http://www. treatallmetals.com.nitrid.htm.
Thomas et al., "Non-Thermal Plasma Aftertreatment of Particulates—Theoretical Limits and Impact on Reactor Design," SAE Spring Fuels and Lubes Conference, Paris, France, 27 pages—Jun. 19-22, 2000—http://www.aeat.co.uk/electrocat/sae/ saepaper.htm.
"Using Non-Thermal Plasma Reactor to Reduce NOx Emissions from CIDI Engines," Office of Energy Efficiency and Renewable Energy, Office of Transportation, 1 page (Apr. 1999).
"Optoelectronic Packaging Applications," March Plasma Systems, Product Description, 2 pages (2002)—http://www.marchplasma. com/opto_app.html.
Paglieri et al., "Palladium Alloy Composite Membranes for Hydrogen Separation," 15th Annual Conf. Fossil Energy Matter, Knoxville, TN (2001), 5 pages.
Peelamedu et al., "Anisothermal Reaction Synthesis of Garnets, Ferrites, and Spinels In Microwave Field," *Materials Research Bulletin* 36:2723-2739 (Dec. 2001).
PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages http://www.photonics.com/dictionary/.
Pingel, "About What Every P/A Should Know About P/M," Powder Metallurgy Co., 9 pages —http://www.powdermetallurgyco.com/ pm_about.htm.
"Plasma Applications," Coalition for Plasma Science, 2 pages (1999, 2000)—http://www.plasmacoalition.org/applications.htm.
"Plasma Carburizing," 1 page—Undated, http://www.ndkinc.co.jp/ ndke04.html.
"Plasma Direct Melting Furnace," Materials Magic, Hitachi Metals Ltd., 3 pages—Undated, http://www.hitachi-metals.co.jp/e/prod/ prod07/p07_2_02.html.
"Classical Plasma Applications," 2 pages (2002)—http://www. plasma.iinpe.br/English/Classical_Applications.htm.
"Plasma Nitride Process Description," Northeast Coating Technologies, 2 pages, Undated, www.northeastcoating.com.
Plasma Science and Technology, "Plasmas for Home, Business and Transportation," 4 pages—Undated. http://www.plasmas.org/rothome.htm.
"Novel Plasma Catalysts Significantly Reduce NOx from Diesel Engines," US Department of Energy research summary, 2 pages (Apr. 2001)—http://www.ott.doe.gov/success.html.
"Printed Circuit Board (PCB) Plasma Applications," March Plasma Systems product descriptions, 2 pages (2002)—http://www. marchplasma.com/pcb_app.01.htm.
Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).
Roy et al., "Full Sintering of Powdered-Metal Bodies In A Microwave Field," *Nature* 399:668-670 (Jun. 17, 1999).
Roy et al., "Major phase transformations and magnetic property changes caused by electromagnetic fields at microwave frequencies," *J. Mat. Res.* 17(12):3008-3011 (2002).
Roy et al., "Microwave Processing: Triumph of Applications-Driven Science in WC-Composites And Ferroic Titanates," *Ceramic Transactions* 80:3-26, (1997).
Rusanov, Introduction to the Hydrogen Energy & Plasma Technologies Institute: Russian Research Centre Kurchatov Institute, 13 pages, Undated—http://www.kiae.ru/eng/str/ihept/oiivept.htm.
Samant et al., "Glow Discharge Plasma Nitriding of Al 6063 Samples and Study of Their Surface Hardness," *Metallofiz. Noveishe Tekhnol.* 23(3):325-333 (2001).
Sato et al., "Surface Modification of Pure Iron by rf Plasma Nitriding with dc Bias Voltage Impression," *Hyomen Gijutsu* 48(3):317-323 (1997) (English Abstract).
Saveliev et al., "Effect of Cathode End Caps and a Cathode Emissive Surface on Relativistic Magnetron Operation," *IEEE Transactions on Plasma Science* 28:3.478-484 (Jun. 2000).
SC/Tetra Engine Manifold Application, 2 pages (2001)—http:// www.sctetra.com/applications/01_manifold.htm.
Shulman, "Microwaves In High-Temperature Processes," GrafTech Intl. Ltd., 8 pages (Mar. 2003) http://www.industrialheating.com/ CDA/ArticleInformation/features/BNP_Features_Item/ 0,2832,94035,00.html.
Slone et al., "NOx Reduction For Lean Exhaust Using Plasma Assisted Catalysis," Noxtech Inc., 5 pages (2000)—http://www.osti. gov/fcvt/deer2000/bhattpa.pdf.
Stockwell Rubber Company, Inc., "Conductive Silicone Rubber Compounds Product Selection Guide," Electrically Conducive Materials Chart, 3 pages, Undated—http://www.stockwell.com/ electrically_conducive_produc.htm.
Sumitomo Heavy Industries, Ltd., "Spark Plasma Sintering," 3 pages (2001)—http://www.shi.co.jp/sps/eng/.
"Surface Hardening" Services Description for AHS Corp., 5 pages, Undated—http://www.ahscorp.com/surfaceh.html.
Takizawa et al. "Synthesis of inorganic materials by 28 GHz Microwave Irradiation," *Transaction of the Materials Research Society of Japan* 27(1):51-54 (2002).
Taube et al., "Advances in Design of Microwave Resonance Plasma Source," American Institute of Chemical Engineering, 2004 Annual Meeting, Presentation (Nov. 2004).

"testMAS: Pressure Sintering," 11 pages, Undated—http://cybercut.berkley.edu/mas2/processes/sinter_pressure.

Wolf et al., "The Amazing Metal Sponge: Simulations of Palladuim-Hydride," 2 pages, Undated—http://www.psc.edu/science/Wolf/Wolf.html.

Toyota Motor Sales, "Emission Sub Systems—Catalytic Converter," 10 pages, Undated.

Uchikawa et al., "New Technique of Activating Palladium Surface for Absorption of Hydrogen of Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

"Welding Plastic Parts," Business New Publishing Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1):52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jul. 23, 2003, in PCT/US03/14037.
International Search Report issued on Aug. 15, 2003, in PCT/US03/14124.
International Search Report issued on Sep. 10, 2003, in PCT/US03/14132.
International Search Report issued on Aug. 14, 2003, in PCT/US03/14052.
International Search Report issued on Aug. 14, 2003, in PCT/US03/14054.
International Search Report issued on May 10, 2004, in PCT/US03/14036.
International Search Report issued on Aug. 9, 2003, in PCT/US03/14053.
International Search Report issued on Feb. 25, 2004, in PCT/US03/14034.
International Search Report issued on Sep. 19, 2003, in PCT/US03/14039.
International Search Report issued on Aug. 29, 2003, in PCT/US03/14038.
International Search Report issued on Dec. 30, 2003, in PCT/US03/14133.
International Search Report issued on Aug. 28, 2003, in PCT/US03/14035.
International Search Report issued on Jul. 29, 2003, in PCT/US03/14040.
International Search Report issued on Sep. 10, 2003, in PCT/US03/14134.
International Search Report issued on Aug. 29, 2003, in PCT/US03/14122.
International Search Report issued on Sep. 30, 2003, in PCT/US03/14130.
International Search Report issued on May 24, 2004, in PCT/US03/14055.
International Search Report issued on May 26, 2004, in PCT/US03/14137.
International Search Report issued on Aug. 29, 2003, in PCT/US03/14123.
International Search Report issued on Aug. 29, 2003, in PCT/US03/14121.
International Search Report issued on Sep. 16, 2003, in PCT/US03/14136.
International Search Report issued on May 25, 2004, in PCT/US03/14135.
Written Opinion issued on Apr. 13, 2004, in PCT/US03/014037.
Examination Report issued on Feb. 24, 2004, in PCT/US03/14054.
Written Opinion issued on Dec. 22, 2003, in PCT/US03/14053.
Examination Report issued on Apr. 26, 2004, in PCT/US03/14053.
Written Opinion issued on Dec. 22, 2003, in PCT/US03/14123.
Examination Report issued on Apr. 26, 2004, in PCT/US03/14123.
Quayle Action issued on Apr. 19, 2004, in U.S. Appl. No. 10/430,414.
Office Action issued on May 18, 2004, in U.S. Appl. No. 10/430,426.
Reply to Office Action filed on Nov. 18, 2004, in U.S. Appl. No. 10/430,426.
Office Action issued on Feb. 24, 2005, in U.S. Appl. No. 10/430,426.
Willert-Porada, M., "Alternative Sintering Methods" 1 page Abstract dated Nov. 8, 2001, http://www.itap.physik.uni-stuttgart.de/~gkig/neu/english/welcome.php?/-gkig/neu/abstracts/abstract_willert-porada.html.
International Preliminary Examination Report completed on Feb. 22, 2005, in PCT/US03/014037.
Office Action in Chinese Appl. No. 03810272.2 issued Feb. 10, 2006.
Quayle Action mailed Apr. 19, 2005 for U.S. Appl. No. 10/449,600.
Response to Quayle Action filed May 12, 2005 for U.S. Appl. No. 10/449,600.
Office Action mailed Jul. 27, 2005 for U.S. Appl. No. 10/449,600.
Response filed Oct. 27, 2005 for U.S. Appl. No. 10/449,600.
International Search Report issued on Jun. 14, 2005, in PCT/US03/38459.
Office Action mailed Jul. 27, 2005 for U.S. Appl. No. 10/430,415.
Response to Office Action dated Dec. 22, 2005 for U.S. Appl. No. 10/430,415.

* cited by examiner

PLASMA-ASSISTED DECRYSTALLIZATION

CROSS-REFERENCE OF RELATED APPLICATIONS

Priority is claimed to U.S. Provisional Patent Application Ser. No. 60/378,693, filed May 8, 2002, No. 60/430,677, filed Dec. 4, 2002, and No. 60/435,278, filed Dec. 23, 2002, all of which are fully incorporated herein by reference.

FIELD OF THE INVENTION

This invention relates to methods and apparatus for decrystallizing objects, and in particular, for decrystallizing objects using a plasma.

BACKGROUND

Conventional decrystallization normally involves application of a substantial amount of heat to a given material for a period of time. Normally, the application of heat is used to anneal, melt, or otherwise induce a phase transformation in a given material or material compound, at least at its surface. These heat treatments generally melt, or otherwise render amorphous, the surface of an object.

Such decrystallization methods can be limiting, in part because of the time and energy required, and in part because of the complex phase transformations needed to produce important ceramics, such as $BaTiO_3$. To produce $BaTiO_3$, for example, $BaCO_3$ and $TiO_2$ can be mixed and heated, which can require several tens of hours at temperatures at or above 1,000 degrees Celsius. Even after such an extensive heat treatment, only one phase of $BaTiO_3$ may be observed, and this phase may not be glassy nor noncrystalline.

Another reported decrystallization technique applied microwave energy to produce a multiphase $BaTiO_3$ in a matter of minutes at a temperature of about 700 degrees Celsius. This technique, however, required a substantial amount of sustained microwave energy and placed the specimens in particular microwave "hot spots" (i.e., regions of high magnetic field intensity).

BRIEF SUMMARY OF A FEW ASPECTS OF THE INVENTION

Methods and apparatus for plasma-assisted decrystallization are provided. In one embodiment, the surface of an object can be decrystallized by exposing the surface to the plasma for a period of time sufficient to at least partially decrystallize the surface. A decrystallizing plasma can be formed, for example, in a cavity by subjecting a gas to an amount of electromagnetic radiation in the presence of a plasma catalyst.

In one embodiment consistent with this invention, the decrystallizing method can include flowing a gas into a processing cavity (e.g., a multi-mode cavity) and igniting a plasma by subjecting the gas in the cavity to electromagnetic radiation having a frequency less than about 333 GHz, optionally in the presence of a plasma catalyst. During or after plasma ignition, the surface of the object can be exposed to the plasma.

A plasma-assisted decrystallization system may also be provided. The system can include a vessel in which a cavity is formed, an electromagnetic radiation source coupled to the cavity such that the electromagnetic radiation source can direct electromagnetic radiation into the cavity during the decrystallization process, a gas source coupled to the cavity so that a gas can flow into the cavity during the decrystallization process, and a plasma controller programmed to control at least one of the radiation and the gas to generate a sufficient amount of plasma to decrystallize the surface. The system can also include at least one plasma catalyst located in the presence of the radiation (e.g., located in or near the cavity).

Plasma catalysts for initiating, modulating, and sustaining a plasma can also be provided. A plasma catalyst may be passive or active. A passive plasma catalyst can include any object capable of inducing a plasma by deforming a local electric field (e.g., an electromagnetic field) consistent with this invention, without necessarily adding additional energy. An active plasma catalyst can be any particle or high energy wave packet capable of transferring a sufficient amount of energy to a gaseous atom or molecule to remove at least one electron from the gaseous atom or molecule in the presence of electromagnetic radiation. In both the passive and active cases, a plasma catalyst can improve, or relax, the environmental conditions required to ignite a plasma for performing various types of decrystallization processes.

Additional plasma catalysts, and methods and apparatus for igniting, modulating, and sustaining a plasma for the purpose of decrystallizing an object are also provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE EMBODIMENTS

This invention can relate to methods and apparatus for initiating, modulating, and sustaining a plasma for a variety of decrystallization applications, including, for example, enhancing corrosion resistance of metal alloys used in the automotive industry. Thus, this invention can be used for controllable plasma-assisted decrystallization that may lower energy costs and increase alloy durability and manufacturing flexibility.

One decrystallizing method consistent with this invention can include adding a gas, a plasma catalyst, and electromagnetic radiation to a cavity for catalyzing a decrystallizing plasma. As used herein, any plasma formed with a plasma catalyst for the purpose of decrystallizing one or more objects is a "catalyzed decrystallization plasma," or more simply, "a decrystallization plasma." The catalyst can be passive or active. A passive plasma catalyst can include any object capable of inducing a plasma by deforming a local electric field (e.g., an electromagnetic field) consistent with this invention without necessarily adding additional energy through the catalyst, such as by applying a voltage to create a spark. An active plasma catalyst, on the other hand, may be any particle or high energy wave packet capable of transferring a sufficient amount of energy to a gaseous atom or molecule to remove at least one electron from the gaseous atom or molecule, in the presence of electromagnetic radiation.

The following commonly owned U.S. patent applications are hereby incorporated by reference in their entireties: U.S. patent application Ser. No. 10/513,221; U.S. patent application Ser. No. 10/513.393; PCT Application US03/14132, now expired; U.S. patent application Ser. No. 10/513,394; U.S. patent application Ser. No. 10/513,305; U.S. patent application Ser. No. 10/513,607; U.S. patent application Ser. No. 10/430,414, now U,S. Pat. No. 6,870,124; PCT Application No. US03/14034, now expired; U.S. patent application Ser. No. 10/430,415; PCT Patent Application No. US03/14133, (now expired); U.S. patent application Ser. No. 10/513,606; U.S. patent application Ser. No. 10/513, 309; U.S. patent application Ser. No. 10/513,220; PCT Application No. US03/14122, now expired; U.S. patent application Ser. No. 10/513,397; U.S. patent application Ser. No. 10/513,605; PCT Application No. US03/14137, now expired; U.S. patent application Ser. No. 10/430,426; PCT Application No. US03/14121, now expired; U.S. patent application Ser. No. 10/513,604; and PCT Application No. US03/14135, now expired.

Illustrative Plasma-Assisted Decrystallization System

Figure 1:
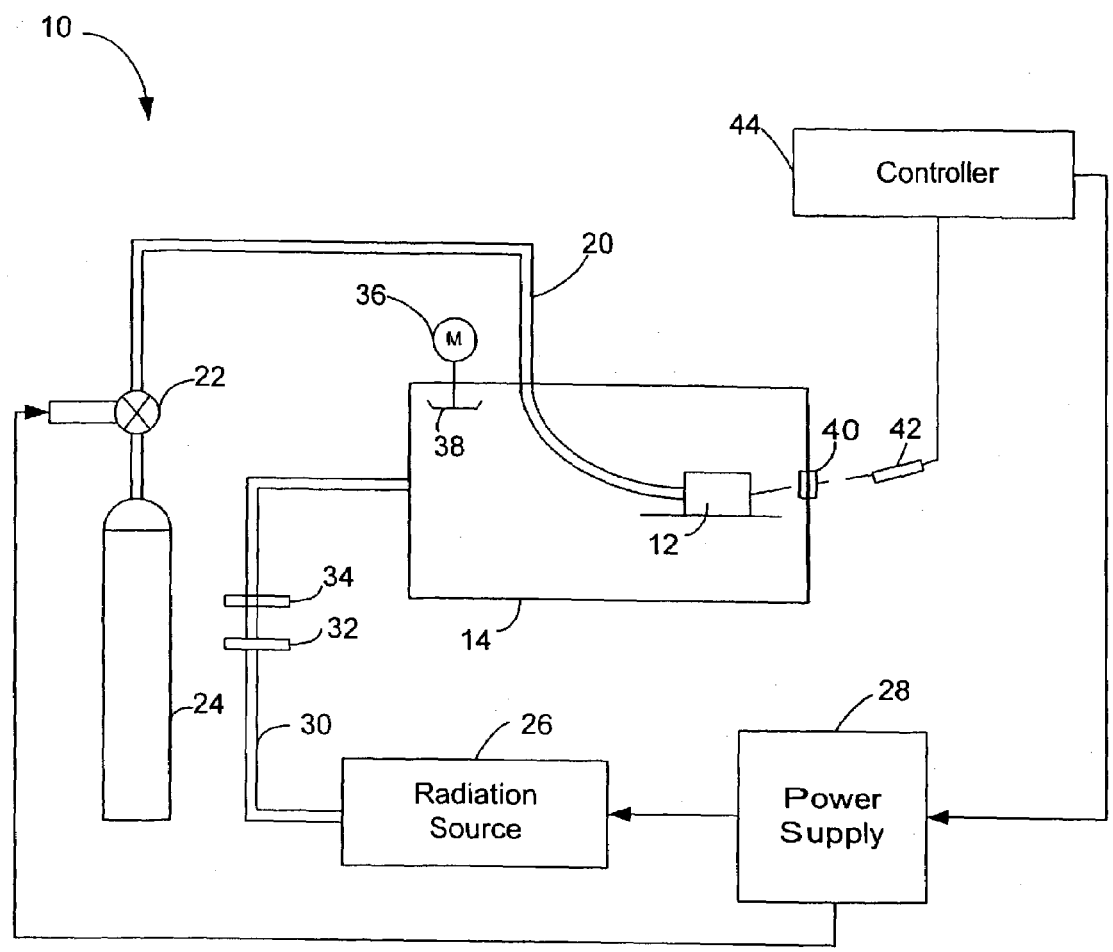
FIG. 1 shows a schematic diagram of an illustrative plasma-assisted decrystallization system consistent with this invention.

FIG. 1 shows illustrative plasma-assisted decrystallization system 10 consistent with one aspect of this invention. In this embodiment, cavity 12 can be formed in a vessel positioned inside electromagnetic radiation chamber (i.e., applicator) 14. In another embodiment (not shown), vessel 12 and electromagnetic radiation chamber 14 are the same, thereby eliminating the need for two separate components. The vessel in which cavity 12 is formed can include one or more electromagnetic radiation-transmissive insulating layers to improve its thermal insulation properties without significantly shielding cavity 12 from the electromagnetic radiation.

In one embodiment, cavity 12 is formed in a vessel made of ceramic. Due to the extremely high temperatures that can be achieved with plasmas consistent with this invention, the upper temperature limit for processing is restricted only by the melting point of the ceramic used to make the vessel. In one experiment, for example, a ceramic capable of withstanding about 3,000 degrees Fahrenheit was used. For example, the ceramic material can include, by weight, 29.8% silica, 68.2% alumina, 0.4% ferric oxide, 1% titania, 0.1% lime, 0.1% magnesia, 0.4% alkalis, which is sold under Model No. LW-30 by New Castle Refractories Company, of New Castle, Pa. It will be appreciated by those of ordinary skill in the art, however, that other materials, such as quartz, and those different (e.g., those having higher or lower melting temperatures) from the ceramic material described above, can also be used consistent with the invention.

In one successful experiment, a plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing the gas. The size of the cavity can depend on the desired plasma process being performed. Also, the cavity should at least be configured to prevent the plasma from rising/floating away from the primary processing region, even though the plasma may not contact the substrate.

Cavity 12 can be connected to one or more gas sources 24 (e.g., a source of argon, nitrogen, hydrogen, xenon, krypton, etc.) by line 20 and control valve 22, which may be powered by power supply 28. Line 20 may be tubing (e.g., between about $\frac{1}{16}$ inch and about $\frac{1}{4}$ inch, such as about $\frac{1}{8}$"), but could be any device capable of supplying gas. Also, if desired, a vacuum pump can be connected to the chamber to remove any undesirable contaminants that may be generated during plasma processing.

A radiation leak detector (not shown) was installed near source 26 and waveguide 30 and connected to a safety interlock system to automatically turn off the electromagnetic radiation power supply if a leak above a predefined safety limit, such as one specified by the FCC and/or OSHA (e.g., 5 mW/cm$^2$), was detected.

Electromagnetic radiation source 26, which can be powered by electrical power supply 28, directs electromagnetic radiation into chamber 14 through one or more waveguides 30. It will be appreciated by those of ordinary skill in the art that electromagnetic source 26 can be connected directly to chamber 14 or cavity 12, thereby eliminating waveguide 30. The electromagnetic radiation entering chamber 14 or cavity 12 is used to ignite a plasma within the cavity. This catalyzed plasma can be substantially modulated or sustained and confined to the cavity by coupling additional electromagnetic radiation with the catalyst.

Electromagnetic radiation can be supplied through circulator 32 and tuner 34 (e.g., 3-stub tuner). Tuner 34 can be used to minimize the reflected power as a function of changing ignition or processing conditions, especially before the catalyzed plasma has formed because electromagnetic radiation will be strongly absorbed by the plasma after its formation.

As explained more fully below, the location of electromagnetic radiation-transmissive cavity 12 in chamber 14 may not be critical if chamber 14 supports multiple modes, and especially when the modes are continually or periodically mixed. As also explained more fully below, motor 36 can be connected to mode-mixer 38 for making the time-averaged electromagnetic radiation energy distribution substantially uniform throughout chamber 14. Furthermore, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer output can increase from zero volts as the temperature rises to within the tracking range. The pyrometer can be used to sense radiant intensities at two or more wavelengths and to fit those intensities using Planck's law to determine the temperature of the work piece. The pyrometer can also establish the temperature of a species present in the plasma by monitoring its excited state population distribution from the emission intensities at two discrete transitions.

Sensor 42 can develop output signals as a function of the temperature or any other monitorable condition associated with a work piece (not shown) within cavity 12 and provide the signals to controller 44. Dual temperature sensing and heating, as well as automated cooling rate and gas flow controls can also be used. Controller 44 in turn can be used to control operation of power supply 28, which can have one output connected to electromagnetic radiation source 26 as described above, and another output connected to valve 22 to control gas flow into cavity 12.

The invention has been practiced with equal success employing electromagnetic radiation sources at both 915 MHz and 2.45 GHz, provided by Communications and Power Industries (CPI), although radiation having any frequency less than about 333 GHz can be used. The 2.45 GHz system provided continuously variable electromagnetic radiation power from about 0.5 kilowatts to about 5.0 kilowatts. Consistent with one embodiment of the present invention, the electromagnetic radiation power density during decrystallization may be between about 0.05 W/cm$^3$ and about 100 W/cm$^3$, for example, at about 2.5 W/cm$^3$. A 3-stub tuner allowed impedance matching for maximum power transfer and a dual directional coupler was used to measure forward and reflected powers. Also, optical pyrometers were used for remote sensing of the substrate temperature.

As mentioned above, radiation having any frequency less than about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment was computer controlled using LabVIEW® 6i software, which provided real-time temperature monitoring and electromagnetic radiation power control. LabVIEW® graphical development environment was used to automate data acquisition, instrument control, measurement analysis, and data presentation. LabVIEW® is available from the National Instruments Corporation, of Austin, Tex.

Noise was reduced by using sliding averages of suitable number of data points. Also, to improve speed and computational efficiency, the number of stored data points in the buffer array were limited by using shift registers and buffer sizing. The pyrometer measured the temperature of a sensitive area of about 1 cm$^2$ which was used to calculate an average temperature. The pyrometer sensed radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described for example, in commonly owned, concurrently filed in PCT Application US03/14135, now expired, which is hereby incorporated by reference in its entirety.

Chamber 14 had several glass-covered viewing ports with electromagnetic radiation shields and one quartz window for pyrometer access. Several ports for connection to a vacuum pump and a gas source were also provided, although not necessarily used.

System 10 also included a closed-loop de-ionized water cooling system (not shown) with an external heat exchanger cooled by tap water. During operation, the de-ionized water first cooled the magnetron, then the load-dump in the circulator (used to protect the magnetron), and finally the electromagnetic radiation chamber through water channels welded on the outer surface of the chamber.

Plasma Catalysts

As mentioned previously, a plasma catalyst consistent with this invention can include one or more different materials and may be either passive or active. A plasma catalyst can be used, among other things, to ignite, modulate, and/or sustain a decrystallization plasma at a gas pressure that is less than, equal to, or greater than atmospheric pressure.

One method of forming a plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can also be a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst can also be a powder consistent with this invention, and need not be made of nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 1A:
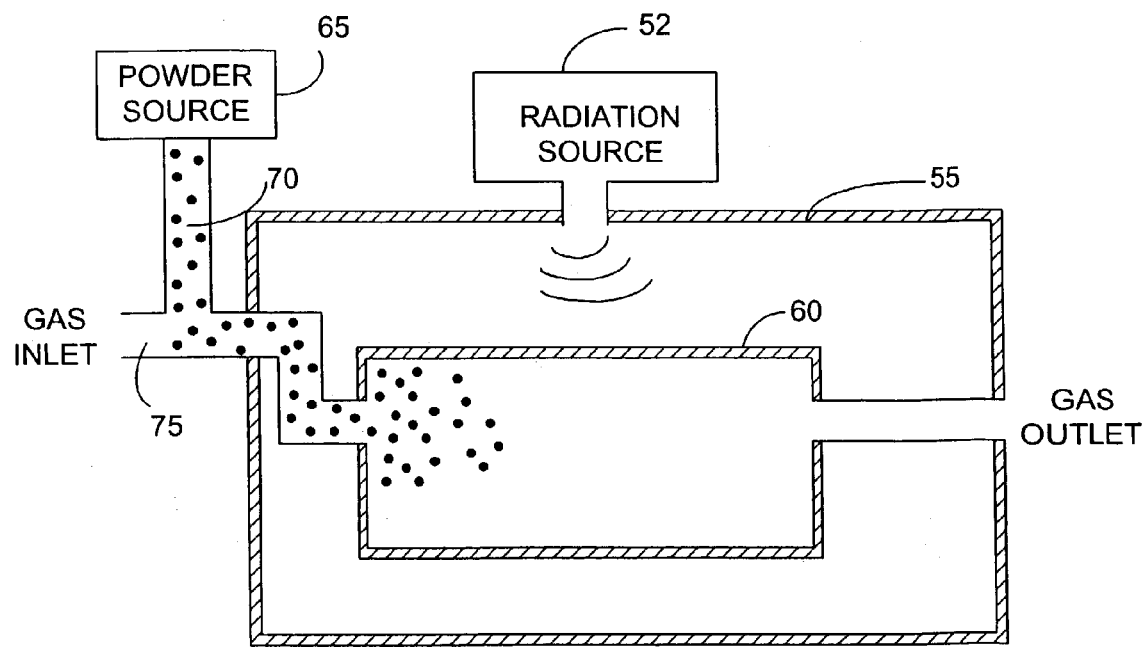
FIG. 1A shows an illustrative embodiment of a portion of a plasma-assisted decrystallization system for adding a powder plasma catalyst to a plasma cavity for igniting, modulating, or sustaining a plasma in a cavity consistent with this invention.

In one embodiment, the powder catalyst can be carried into the cavity and at least temporarily suspended with a carrier gas. The carrier gas can be the same or different from the gas that forms the decrystallization plasma. Also, the powder can be added to the gas prior to being introduced to the cavity. For example, as shown in FIG. 1A, electromagnetic radiation source 52 can supply radiation to electromagnetic radiation cavity 55, in which plasma cavity 60 is placed. Powder source 65 provides catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a decrystallization plasma by moving, conveying, drizzling, sprinkling, blowing, or otherwise feeding the powder into or within the cavity.

In one experiment, a decrystallization plasma was ignited in a cavity by placing a pile of carbon fiber powder in a copper pipe that extended into the cavity. Although sufficient electromagnetic (microwave) radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the electromagnetic radiation, a plasma was nearly instantaneously ignited in the cavity.

A powder plasma catalyst consistent with this invention can be substantially non-combustible, thus it need not contain oxygen, or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2–3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation of Salt Lake City, Utah. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly conductive. For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, as discussed in greater detail below, one or more materials can be added to the plasma through the catalyst for decrystallizing at least the surface of an object. Thus, the plasma catalyst can include one or more additives and one or more electrically conductive materials in any desirable ratio, depending on the ultimate desired composition of the plasma and the decrystallization process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while sustaining the decrystallization plasma, the catalyst could include a relatively large percentage of additives. It will be appreciated by those of ordinary skill in the art that the component ratio of the plasma catalyst used to ignite and sustain the plasma could be the same and that the ratio can be customized to achieve any desired decrystallization depth.

A predetermined ratio profile can be used to simplify many plasma-assisted decrystallization processes. In some conventional plasma-assisted non-decrystallization processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the current ratio of components in a plasma can depend on the portions of the catalyst currently and/or previously consumed, especially when the flow rate of a gas passing through the plasma chamber is relatively slow.

Figure 2:
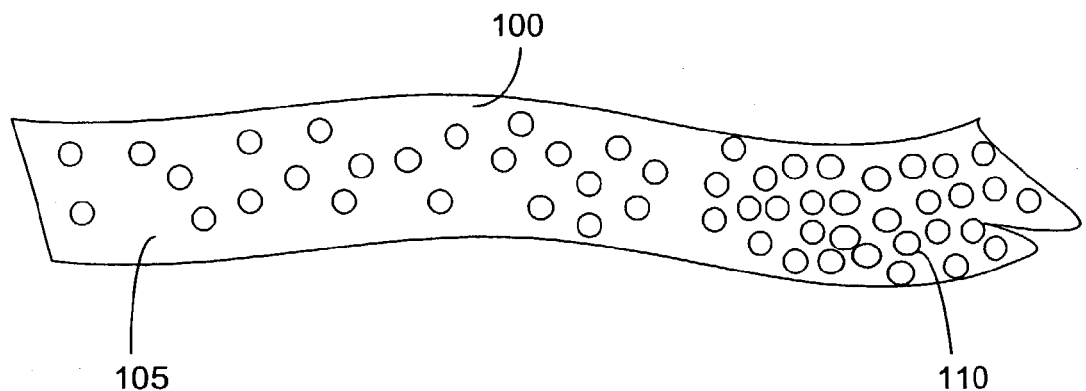
FIG. 2 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 2, the ratio can vary smoothly forming a gradient along a length of catalyst 100. Catalyst 100 can include a strand of material that includes a relatively low concentration of a component at section 105 and a continuously increasing concentration toward section 110.

Figure 3:
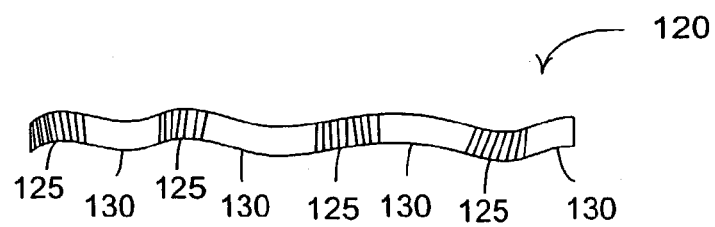
FIG. 3 shows an illustrative plasma catalyst fiber with multiple components at a ratio that varies along its length consistent with this invention.

Alternatively, as shown in FIG. 3, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

Figure 4:
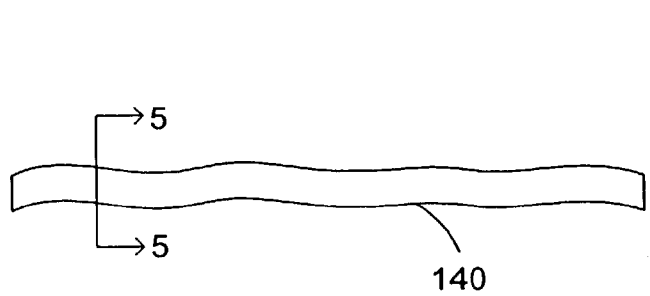
FIG. 4 shows another illustrative plasma catalyst fiber that includes a core under layer and a coating consistent with this invention.
Figure 5:
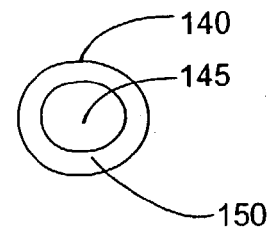
FIG. 5 shows a cross-sectional view of the plasma catalyst fiber of FIG. 4, taken from line 5—5 of FIG. 4, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 4 and 5, for example, show fiber 140, which includes under layer 145 and coating 150. In one embodiment, a plasma catalyst including a carbon core can be coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within an electromagnetic radiation chamber to substantially reduce or prevent electromagnetic radiation energy leakage. In this way, the plasma catalyst does not electrically or magnetically couple with the radiation chamber, the vessel containing the cavity, or to any electrically conductive object outside the chamber. This can prevent sparking at the ignition port and prevents electromagnetic radiation from leaking outside the chamber during the ignition and possibly later if the plasma is sustained. In one embodiment, the catalyst can be located at a tip of a substantially electrically non-conductive extender that extends through an ignition port.

Figure 6:
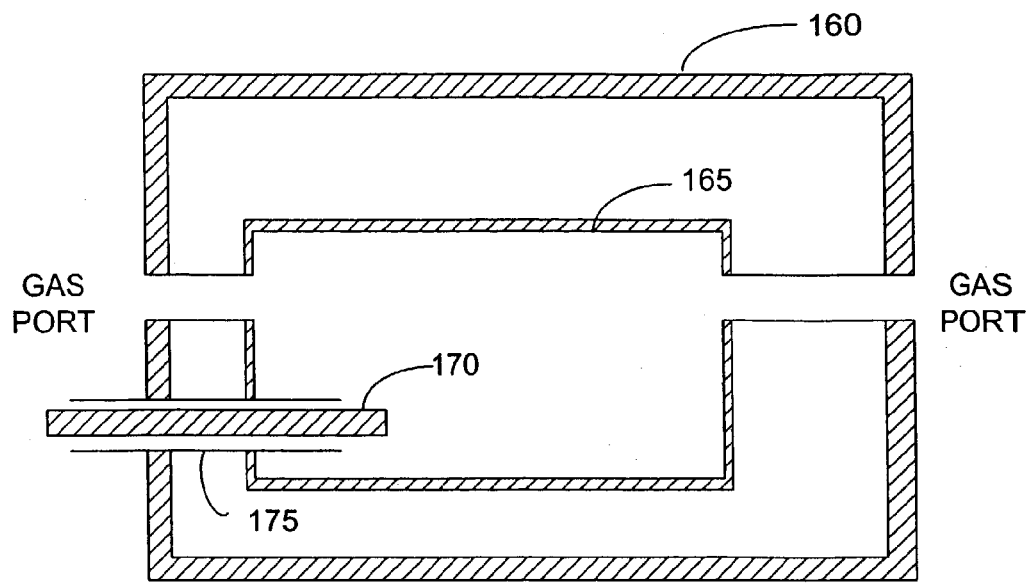
FIG. 6 shows an illustrative embodiment of another portion of a plasma system including an elongated plasma catalyst that extends through an ignition port consistent with this invention.
Figure 7:
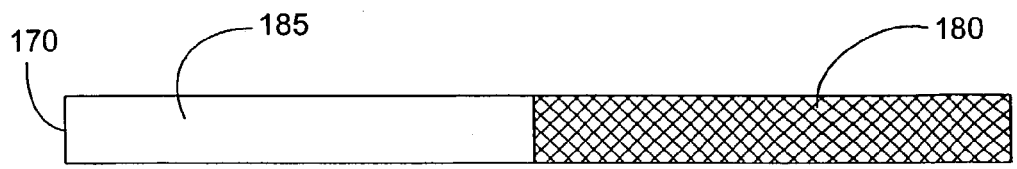
FIG. 7 shows an illustrative embodiment of an elongated plasma catalyst that can be used in the system of FIG. 6 consistent with this invention.

FIG. 6, for example, shows electromagnetic radiation chamber 160 in which plasma cavity 165 can be placed. Plasma catalyst 170 can be elongated and extends through ignition port 175. As shown in FIG. 7, and consistent with this invention, catalyst 170 can include electrically conductive distal portion 180 (which is placed in chamber 160) and electrically non-conductive portion 185 (which is placed substantially outside chamber 160, but may extend somewhat into the chamber). This configuration prevents an electrical connection (e.g., sparking) between distal portion 180 and chamber 160.

Figure 8:
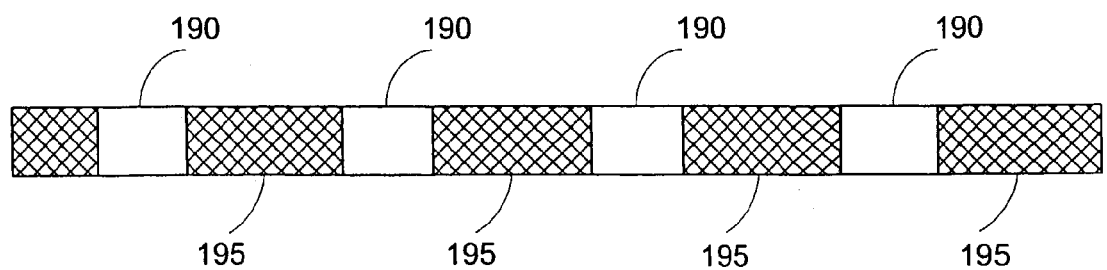
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

Another method of forming a decrystallization plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 9:
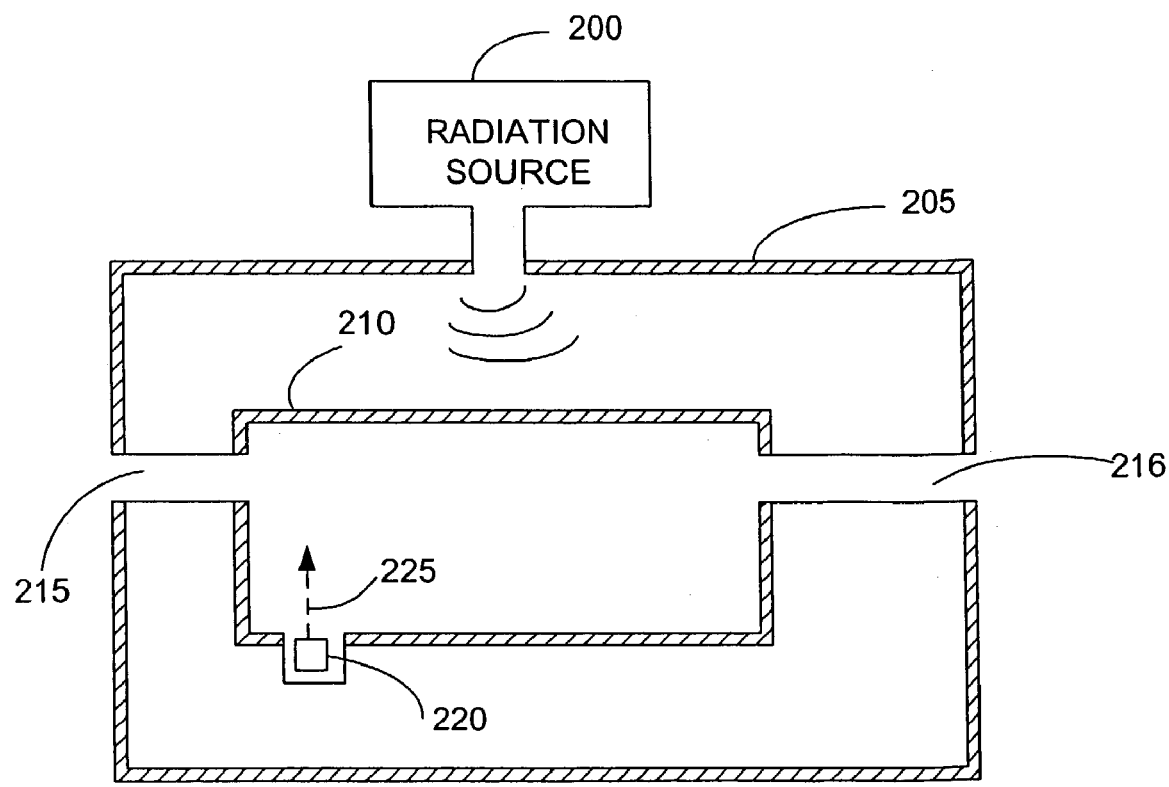
FIG. 9 shows an illustrative embodiment of a portion of a plasma-assisted decrystallization system for directing an active plasma catalyst, in the form of ionizing radiation, into a radiation chamber consistent with this invention.

For example, FIG. 9 shows electromagnetic radiation source 200 directing radiation into electromagnetic radiation chamber 205. Plasma cavity 210 can be positioned inside of chamber 205 and may permit a gas to flow therethrough via ports 215 and 216. Source 220 can direct ionizing particles 225 into cavity 210. Source 220 can be protected by a metallic screen which allows the ionizing particles to go through, but shields source 220 from electromagnetic radiation. If necessary, source 220 can be water-cooled.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the electromagnetic radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-Mode Electromagnetic Radiation Cavities

Electromagnetic radiation waveguides, cavities, and chambers can be designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide, or cavity, the mode can be any one of the various possible patterns of propagating or standing electromagnetic fields. Each mode is characterized by its frequency and polarization of the electric field and/or magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of electromagnetic radiation propagation. Even though electromagnetic radiation appears to travel along the length of a waveguide, it may do so only by reflecting off the inner walls of the waveguide at some angle. Hence, depending upon the propagation mode, the electromagnetic radiation may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because electromagnetic radiation propagates inside the waveguide by reflecting at some angle from the inner walls of the waveguide. In some cases, a third subscript can be added to define the number of half waves in the standing wave pattern along the z-axis.

For a given electromagnetic radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of electromagnetic radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of an electromagnetic radiation reflector). This redistribution desirably provides a more uniform time-averaged field (and therefore plasma) distribution within the cavity.

A multi-mode decrystallization cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the electromagnetic radiation energy is in the cavity.

The distribution of a decrystallization plasma within a cavity may strongly depend on the distribution of the applied electromagnetic radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used to decrystallize consistent with this invention, it will be appreciated by those of ordinary skill in the art that the cavity in which the plasma is formed can be completely closed or partially open. In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

Mode-Mixing

For many decrystallization applications, a cavity containing a uniform plasma is desirable. However, because electromagnetic radiation can have a relatively long wavelength (e.g., in the case of microwave radiation, several tens of centimeters), obtaining a uniform distribution can be difficult to achieve. As a result, consistent with one aspect of this invention, the radiation modes in a multi-mode cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the electromagnetic radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the electromagnetic radiation distribution therein. Any other asymmetrically shaped object can also be used (when rotated), but symmetrically shaped objects can also work, as long as the relative motion (e.g., rotation, translation, or a combination of both) causes some change in the location or orientation of the reflective surfaces. In one embodiment, a mode-mixer can be a cylinder that can be rotated about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the electromagnetic radiation does not change. However, by moving a mode-mixer such that it interacts with the electromagnetic radiation, it is possible to move the positions of the maxima. For example, mode-mixer 38 can be used to optimize the field distribution within cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during a decrystallization plasma ignition. For example, when an electrically conductive fiber is used as a plasma catalyst, it is known that the fiber's orientation can strongly affect the minimum plasma-assistedignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or any other subsequent plasma-assisted decrystallization process.

If the flexible waveguide is rectangular, for example, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma processing, such as during decrystallization, to reduce or create (e.g., tune) "hot spots" in the chamber. When an electromagnetic radiation cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or decrystallizing processes. Thus, in one embodiment, a plasma catalyst can be located at one or more of those ignition or decrystallizing positions.

Multi-Location Plasma Ignition

A decrystallization plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a decrystallization plasma is modulated at a high frequency (i.e., tens of Hertz and higher), or ignited in a relatively large volume, or both, substantially uniform instantaneous striking and re-striking of the plasma can be improved. Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

Figure 10:
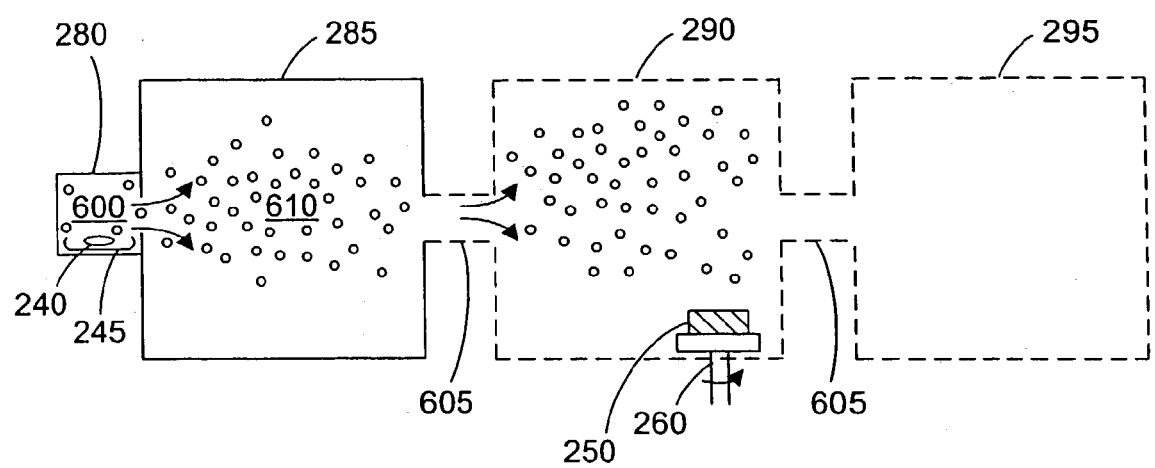
FIG. 10 shows an illustrative embodiment of a portion of the plasma-assisted decrystallization system shown in FIG. 1 with additional optional plasma chambers consistent with this invention.

A dual-cavity arrangement can be used to ignite and sustain a plasma consistent with this invention. In one embodiment, a system includes at least ignition cavity 280 and plasma processing (e.g., decrystallization) cavity 285 in fluid communication with each other, for example, as shown in FIG. 10. Cavities 280 and 285 can be located, for example, inside electromagnetic radiation chamber (i.e., applicator) 14, as shown in FIG. 1.

To form an ignition plasma, a gas in first ignition cavity 280 can be subjected to electromagnetic radiation having a frequency less than about 333 GHz, optionally in the presence of a plasma catalyst. In this way, the proximity of the first and second cavities can permit plasma 600, formed in cavity 280, to ignite plasma 610 in cavity 285, which may be sustained with additional electromagnetic radiation. Additional cavities 290 and 295 are optional, and can be kept in fluid communication with cavity 285 by channel 605, for example. An object to be decrystallized, for example, such as object 250, can be placed in any of cavities 285, 290, or 295 and can be supported by any type of supporting device, such as support 260, which optionally moves or rotates object 250 during the decrystallization procedure.

In one embodiment of this invention, cavity 280 can be very small and designed primarily, or solely for plasma ignition. In this way, very little electromagnetic radiation energy may be required to ignite plasma 600, permitting easier ignition, especially when a plasma catalyst is used consistent with this invention. It will also be appreciated that the cavities used in the plasma system consistent with the present invention can have a variable size, and a controller can be used to control the size of the cavity.

In one embodiment, cavity 280 can be a substantially single mode cavity and cavity 285 can be a multi-mode cavity. When cavity 280 only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used to ignite plasma 600, the catalyst need not be placed in the electric field maximum and, many cases, need not be oriented in any particular direction.

Decrystallization

FIGS. 11-15 show additional illustrative embodiments of methods and apparatus that can be used to decrystallize at least a portion of an object consistent with this invention. FIG. 10, already described above, shows how a dual-cavity system can be used to ignite a plasma in one chamber and form a decrystallization plasma in another. FIG. 10 also shows how additional chambers can be added sequentially, if desired.

Figure 11:
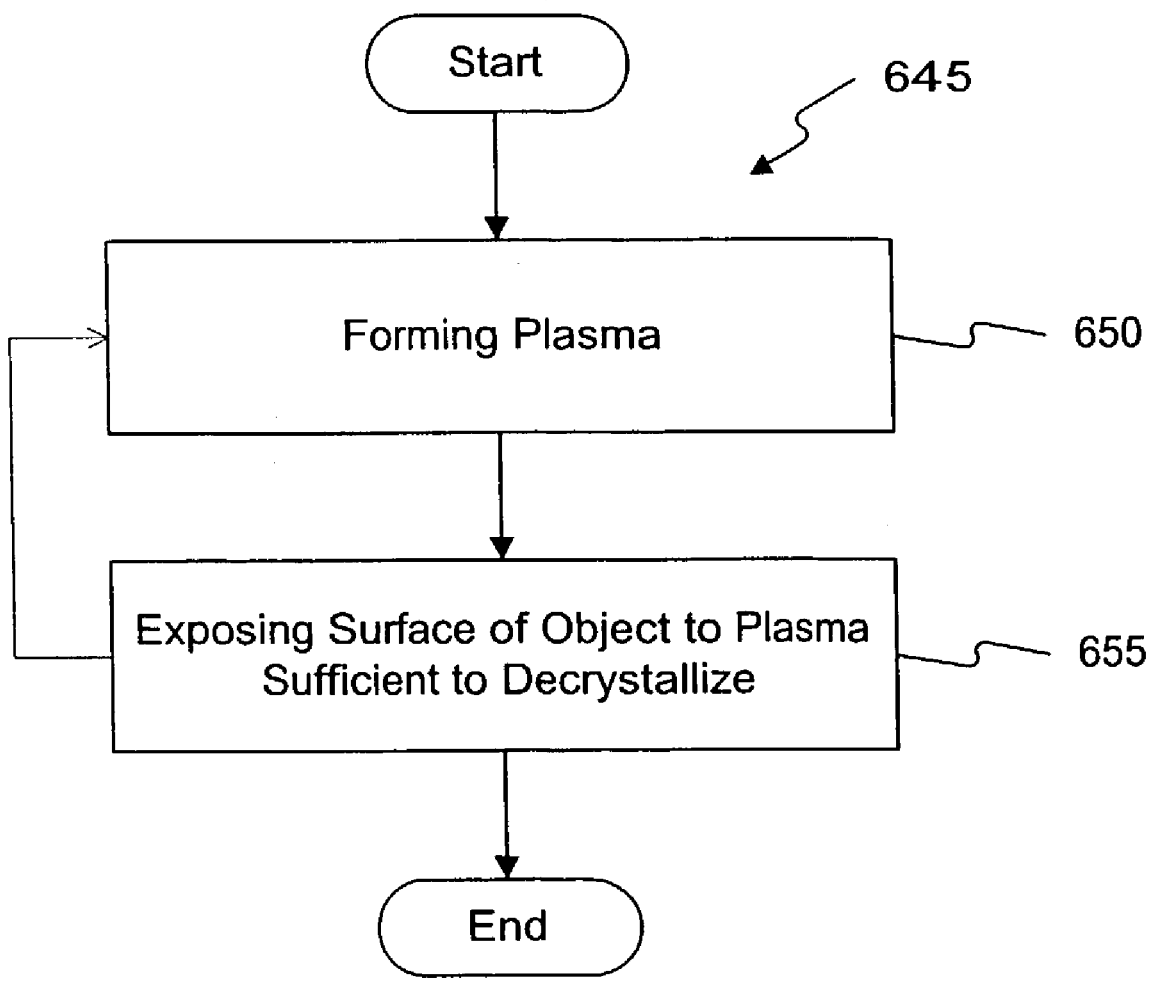
FIG. 11 shows a flow chart of an illustrative method of decrystallizing at least a portion of an object consistent with this invention.

FIG. 11 shows a flow chart of illustrative plasma-assisted decrystallization method 645. Consistent with this invention, the method at least includes exposing an object surface to a plasma for a period of time sufficient to at least partially decrystallize the surface in step 655. The plasma can be formed using any convenient method in step 650, such as by subjecting a gas to electromagnetic radiation. Alternative methods for forming a plasma include subjecting a gas to a sufficient electric or magnetic field, or by raising the gas to a sufficient temperature. In any case, once a plasma is formed, the object being decrystallized can be exposed to it.

It will be appreciated that forming the plasma and exposing an object to the plasma can occur at substantially the same time. In one embodiment, the object can be located in a plasma cavity (see, e.g., FIGS. 12 and 14). In another embodiment, the object can be located near the plasma cavity, such as proximate to an aperture in the cavity. In this way, the plasma formed in the cavity can pass out of or through the aperture to form a plasma jet, which can be used to expose the object (see, e.g., FIG. 13).

The plasma can be modulated or sustained to create any time-dependent exposure profile. For example, an object can be exposed by continuously or periodically directing electromagnetic radiation into a plasma cavity to continuously or periodically forming a decrystallization plasma. Alternatively, plasma formation and exposure can be programmed prior to decrystallization. For example, a plasma-assisted decrystallization apparatus consistent with this invention can further include a controller that controls plasma formation and/or exposure (see, e.g., controller 44 of FIG. 1).

As previously explained, a plasma can be formed consistent with this invention by exposing a gas to radiation in the presence of a plasma catalyst. The plasma catalyst can be passive or active. Alternatively, the plasma can be ignited by any other means, including a spark, for example. In any case, the use of plasma catalyst consistent with this invention can relax the power required to ignite the plasma and improve the strike and restrike periods during plasma modulation. In this way, an effective, energy efficient method of decrystallization can be provided. The location of the plasma catalyst can be located in any convenient position and orientation in the electromagnetic radiation. For example, a plasma catalyst can be located inside or outside the plasma cavity.

In one embodiment, a laser beam (e.g., continuous wave or pulsed, not shown) can be directed toward the surface of the object being decrystallized during the plasma exposure. The laser beam can be collimated or focused to generated very high laser light radiation power intensities at the surface of the object. If the intensity is sufficiently high, the laser beam alone can be used to form the plasma at the surface of the object. Otherwise, the laser beam can be used to simply enhance the effect of a previously formed plasma decrystallization process consistent with this invention.

The temperature of a decrystallization process can be controlled according to any predetermined temperature profile by varying the gas flow through a plasma cavity, the electromagnetic radiation density in the cavity, etc. In one embodiment, the radiation density can be controlled near the surface of the object being decrystallized. Radiation can be directed into a cavity, but a mode-mixer can be used to continuously or periodically redistribute its field distribution, and therefore the plasma distribution. For example, by periodically moving a mode-mixer (e.g., rocking, oscillating, etc.), it is possible to form a plasma at the surface of an object and then periodically move that plasma away from the surface periodically, and vice-versa. Alternatively, the amount of radiation directed into the cavity can be varied. These methods can be particularly useful when decrystallization involves multiple bursts of plasma exposure.

Figure 12:
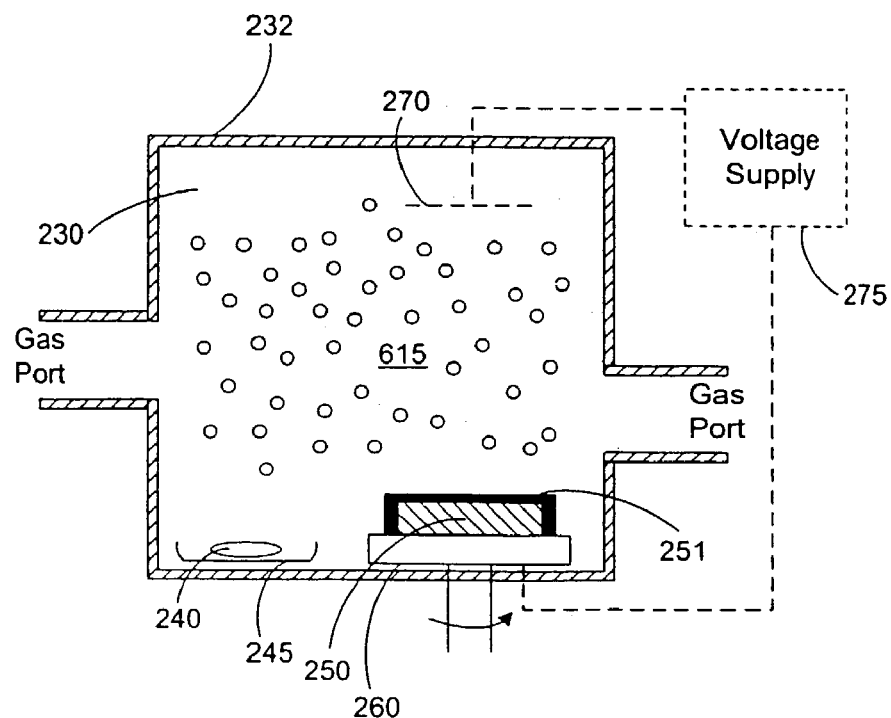
FIG. 12 shows another illustrative embodiment of a portion of the plasma-assisted decrystallization system shown in FIG. 1 for applying a voltage to an object to be decrystallized consistent with this invention.

In one embodiment, as mentioned above, a potential bias can be applied to an object to produce more uniform and rapid decrystallization. For example, as shown in FIG. 12, a potential difference can be applied between electrode 270 and object 250 by voltage supply 275. The applied voltage can, for example, take the form of a continuous or pulsed DC or AC bias. The voltage can be applied outside applicator 14 and in combination with a microwave filter to prevent, for example, microwave energy leakage. The applied voltage may attract charged ions, energizing them, and facilitate decrystallization speed and uniformity. It will be appreciated that the uniformity of decrystallized layer 251 can be increased by moving (e.g., rotating) object 250 using support 260 (e.g., a turntable). Application of a voltage bias may also reduce the amount of electromagnetic radiation needed to ignite, modulate, or sustain the decrystallization plasma.

Decrystallized layer 251 is not restricted to just the top and side surfaces of object 250, rather, it can be located on any surface of object 250 exposed to the plasma. This is depicted, for example, on three surfaces of object 250. Decrystallization can also occur on the front and back surfaces of object 250, but the degree of decrystallization can depend on the intensity, proximity, and exposure time of the plasma. It will be appreciated, for example, that some decrystallization can occur, even without direct exposure to plasma.

It will be appreciated that, although not shown, mount 260 can be specifically designed to hold any shape of object 250 in a manner that would inhibit decrystallization at certain locations. For example, if one desires to decrystallize substantially only the top horizontal surface of object 250, mount 260 can be fashioned like a cup (e.g., with a recess) to hold object 250 so only the top horizontal surface is exposed to plasma 615.

Thus, mount 260 can be designed to decrystallize one or more surfaces of a metal part (e.g. to prevent corrosion), while retaining other crystalline regions (e.g., to improve adhesion during welding or brazing, for example).

Figure 13:
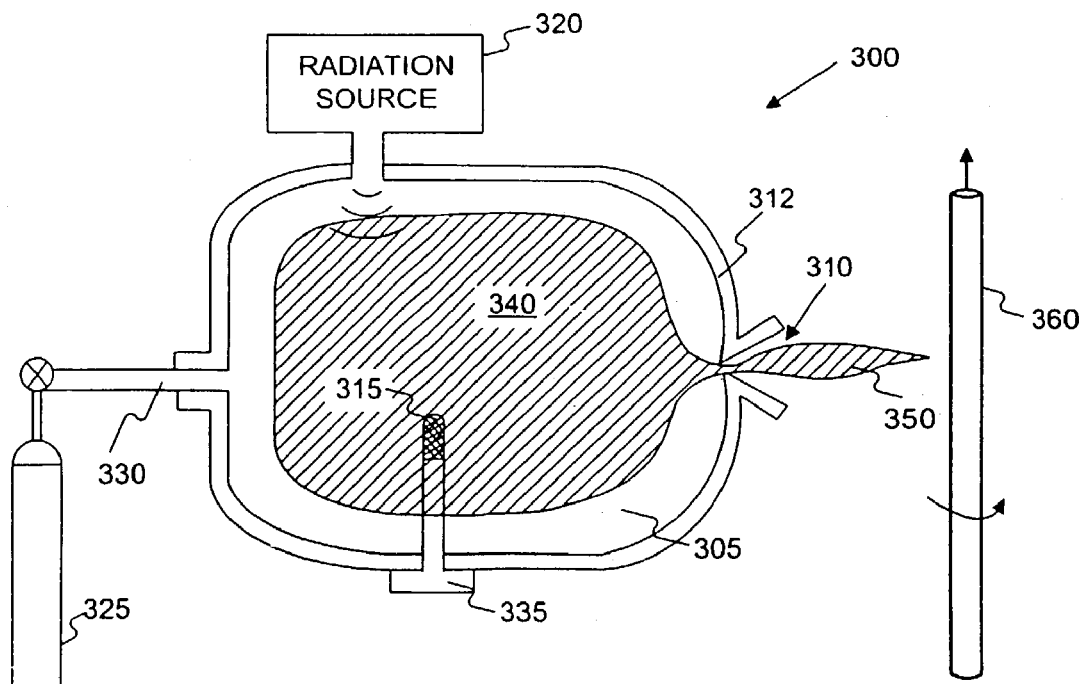
FIG. 13 shows still another illustrative embodiment of a portion of the plasma-assisted decrystallization system for decrystallizing an object through an aperture consistent with this invention.

In another embodiment, the plasma distribution in or at an aperture of a cavity can be held relatively constant, but the object can be moved (continuously, periodically, or according to any preprogrammed sequence) in and out of the plasma. In one example, a plasma jet can be formed at an aperture of a plasma cavity and an object can be moved through it. FIG. 13, for example, shows a simplified schematic diagram of how plasma-jet apparatus 300 can be used to decrystallize a surface of an object. Apparatus 300 can include cavity 305, which can have at least one aperture 310 formed in cavity wall 312, plasma catalyst 315 (e.g., positioned inside or near cavity 305), electromagnetic radiation source 320 for directing electromagnetic radiation into cavity 305, and gas source 325 for directing a gas into cavity 305 through gas port 330.

A method of forming plasma jet 350 can include flowing a gas from source 325 into cavity 305, forming plasma 340 in cavity 305 by subjecting the gas to electromagnetic radiation provided by radiation source 320 in the presence of a plasma catalyst, and allowing at least a portion of plasma 340 to pass out of cavity 305 through aperture 310 such that plasma jet 350 is formed outside cavity 305 proximate to aperture 310. The radiation can have any frequency less than about 333 GHz. It will be appreciated that by using a plasma catalyst consistent with this invention, plasma formation can occur at pressures, for example, at or above atmospheric pressure.

Cavity 305, gas source 325, radiation source 320, and plasma catalyst 315 can be similar to any of the cavities, sources, and catalysts already described above with respect to FIGS. 1–9. Also, the formation of a plasma, including the igniting, modulating, and sustaining of such a plasma within a cavity using a plasma catalyst has also been described hereinabove. Therefore, any of these previously described components and processes can be used to form a plasma jet consistent with this invention, and they will not be described again here.

As shown in FIG. 13, plasma catalyst 315 can be mounted to support structure 335 for positioning catalyst 315 at any position and/or orientation within cavity 305. Structure 335 can be removable, disposable, and/or replaceable, if desired. Thus, structure 335 can be in the form of a replaceable cartridge that contains or supports plasma catalyst 315. Structure 335 can be made from any material capable of withstanding the heat produced by plasma 340. Structure 335 can also be cooled, if desired.

It will be appreciated by those skilled in the art that structure 335 need not include an elongated portion, as shown in FIG. 13, and can be in any convenient form (e.g., a plug having a catalytic surface, a cartridge that contains a catalyst, etc.). When structure 335 extends through cavity wall 312, the portion of structure 335 at wall 312 can be substantially radiation-opaque to prevent radiation directed into cavity 305 by radiation source 320 from leaking outside cavity 305.

During operations, object 360 (e.g., a pipe or a beam, for example) can be brought into the proximity of plasma jet 350 and moved (e.g., rotated, translated, or both) through plasma jet 350 to effectuate decrystallization of part of all of object 360. It will be appreciated that object 360 does not have to be a pipe or beam, but could also be any object for which decrystallization is desired.

Figure 14:
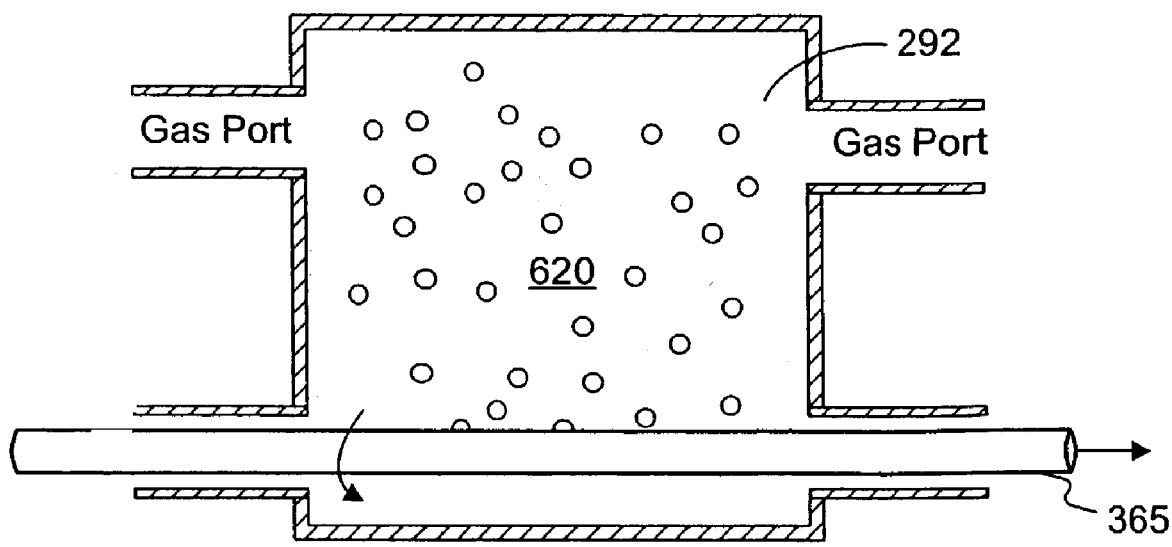
FIG. 14 shows yet another illustrative embodiment of a portion of a plasma-assisted decrystallization system for exposing an object to a plasma by passing through a cavity consistent with this invention.

FIG. 14 shows another illustrative embodiment consistent with this invention in which an object can be exposed to a plasma by passing it through a plasma-assisted decrystallization cavity. In this case, cavity 292 can have additional openings (e.g., ports) for pass through of object 365. Object 365 can be partially or wholly decrystallized upon exposure to plasma 620. It will be appreciated that any desired decrystallization treatment can be obtained by varying plasma intensity and exposure. One way of varying exposure is to vary the rate, or position of object 365 as it passes through cavity 292.

Thus, an object can be elongated and fed directly or indirectly from an extrusion or other continuous or batch manufacturing process. In the case of a metal beam, wire, or pipe, for example, it can move through the cavity in a direction that is substantially parallel to its longitudinal axis and exposure can be regulated by the speed at which the beam moves. It will be appreciated that radiation intensity and gas flow are at least two other parameters that can also be regulated to obtain the desired exposure profile.

In one embodiment, a coaxial-type cavity or applicator can be used to decrystallize an object. A tubular cavity can be formed between the inner surface of a first substantially cylindrical object and the outer surface of a second substantially cylindrical object located within the first object. Thus, the inner surface of the first object, the outer surface of the second object, or both, can be decrystallized by the plasma that forms between these surfaces.

In another embodiment, a metal object can be shaped or cut just before plasma-assisted decrystallization. In some shaping or cutting processes, the object will become relatively hot. Thus, by decrystallizing the surface of the object before it cools, less radiation (e.g., microwave) energy or time may be required to accomplish the desired level of decrystallization.

The amount of plasma exposure required to accomplish a desired level of decrystallization can depend on a number of factors, including the material composition and temperature, the plasma strength, the plasma temperature, etc. Still, plasma-assisted decrystallization of a block consistent with this invention has been achieved in a period of time less than about 25 minutes. By varying these factors, the time period can be less than about 120 seconds, and even less than about 10 seconds. In one embodiment, the electromagnetic radiation had a time-averaged power density in the plasma greater than about 1 W/cm$^3$, and can have a time-averaged power density, for example, greater than about 10 W/cm$^3$.

Although not necessary, plasma exposure can occur such that the surface of the object being decrystallized can be positioned adjacent to a magnetic field vector maximum. In one embodiment, the vector has a direction that is substantially perpendicular to the surface. Such exposure can occur, for example, in a substantially single mode or multi-mode cavity.

Alternatively, the object can be any part that may need decrystallization, such as a metal or metal alloy part, or a ceramic. For example, the object may be an automotive part such as a brake banjo block, a cam lobe, a gear, a seat component, a rail lever, a socket fastener, or a parking brake part. One will appreciate that the object is not limited to shaped automotive parts or metals or metal alloys.

Figure 15:
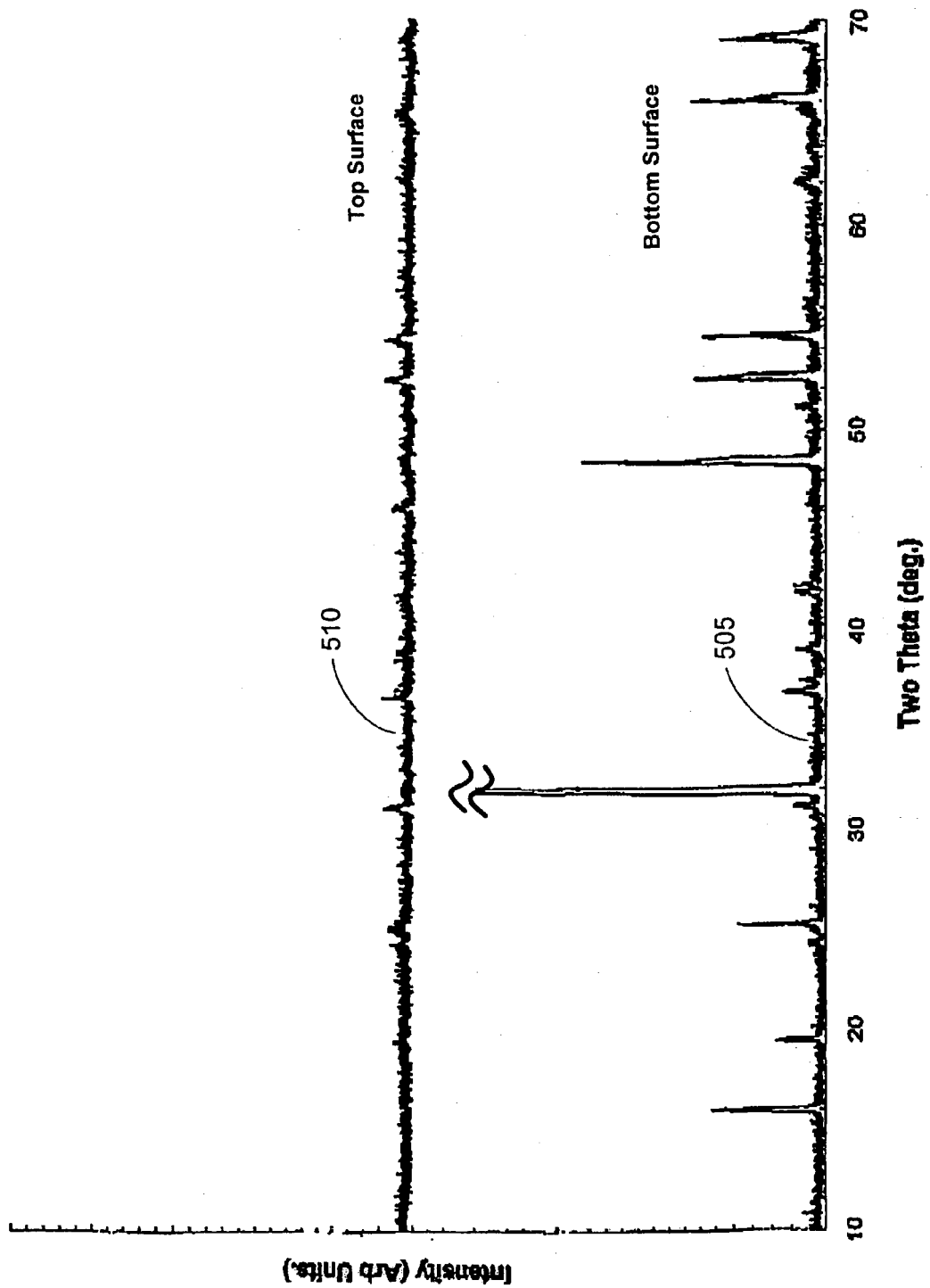
FIG. 15 shows two sets of x-ray diffraction data from a tungsten carbide sample for two of its surfaces, one of which was subjected to plasma-assisted decrystallization consistent with this invention.

FIG. 15 shows the x-ray diffraction data for one successful plasma-assisted decrystallization experiment consistent with this invention. In this case, the top surface of a compressed powder of tungsten-carbide, which is inherently a ceramic based on its material properties, was placed on a quartz plate and exposed to a decrystallization plasma. The volume of the plasma cavity used in the experiment was about 205 cubic centimeters, and 500 W of microwave radiation were applied for about 25 minutes (a time-averaged microwave power density in the plasma of about 2.5 W/cm$^3$). The temperature was maintained at about 1,300 degrees Celsius and the plasma was formed from argon and hydrogen gas. Portions of the upper surface of the specimen were melted, creating an amorphous tungsten carbide layer at least about 2–3 mm deep. Although the upper surface (exposed to the plasma) melted, the lower surface (not exposed to the plasma) did not melt.

X-ray diffraction data 505 from the unexposed portion (e.g., "bottom surface") shows a large number of peaks, indicative of a crystallized surface. X-ray diffraction data 510 collected from the plasma-exposed portion (e.g., "top surface"), however, shows very few peaks indicative of a substantially decrystallized surface.

One skilled in the art will appreciate that surface melting may not be required to induce decrystallization. That is, mere exposure of an object to the plasma may be sufficient. Moreover, the effectiveness of plasma exposure may be increased when an applied voltage is used, as shown in FIG. 12.

Although igniting, modulating, or sustaining a decrystallization plasma consistent with this invention can occur at atmospheric pressure (using, for example, a plasma catalyst), decrystallization of object 250 can occur at any desirable pressure, including below, at, or above atmospheric pressure. Furthermore, plasma pressure and temperature can be varied, if desired. For example, using a system (like the one shown in FIG. 10) allows one to modulate or sustain decrystallization plasma 610 at atmospheric pressure in cavity 285, and decrystallize the surface of object 250 in another cavity (e.g., cavity 285, 290, or 295) at a pressure higher or lower than atmospheric pressure. Such flexibility can be very desirable in, for example, large scale manufacturing processes of complex shapes and materials.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A method of decrystallizing a surface of an object comprising:

initiating a microwave plasma at substantially atmospheric conditions; by subjecting a gas to electromagnetic radiation having a frequency less than about 333 GHz in the presence of a plasma catalyst;

exposing the surface to the plasma for a period of time sufficient to at least partially decrystallize the surface;

wherein the exposing comprises directing electromagnetic radiation into a cavity, wherein the directing is selected from a group consisting of continuously directing, periodically directing, programmed directing, and any combination thereof; and controlling a temperature associated with the plasma according to a predetermined temperature profile by varying at least one of a gas flow through the cavity and an electromagnetic radiation density near the surface of the object.

2. The method of claim 1, wherein the plasma catalyst is passive plasma catalyst.

3. The method of claim 2, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

4. The method of claim 2, wherein the plasma catalyst includes at least one of x-rays, gamma radiation, alpha particles, beta particles, neutrons, protons, arid any combination thereof.

5. The method of claim 2, wherein the plasma catalyst includes at least one of electrons and ions.

6. The method of claim 1, wherein the catalyst comprises at least one of metal, inorganic material, carbon, carbon-based alloy, carbon-based composite, electrically conductive polymer, conductive silicone elastomer, polymer nanocomposite, and an organic-inorganic composite.

7. The method of claim 6, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

8. The method of claim 6, wherein the catalyst comprises carbon fiber.

9. The method of claim 1, wherein the directing comprises sustaining the plasma.

10. The method of claim 1 wherein the directing comprises directing the electromagnetic radiation along a path, such that a plasma catalyst is located at some point along the path.

11. The method of claim 1, wherein the exposing is at a location, the method further comprising moving the surface relative to the location by a moving method elected from a group consisting of periodically moving, continuously moving, programmed moving, and any combination thereof.

12. The method of claim 11, wherein the object is a metal, the method further comprising shaping the metal before the exposing.

13. The method of claim 1, wherein the period of time is less than about 25 minutes.

14. The method of claim 13, wherein the period of time is less than about 120 seconds.

15. The method of claim 14, wherein the period of time is less than about 10 seconds.

16. The method of claim 1, wherein, during the exposing, the electromagnetic radiation has a time-averaged power density in the plasma greater than about 1 W/cm$^3$.

17. The method of claim 16, wherein the time-averaged power density is greater than about 10 W/cm$^3$.

18. The method of claim 1, wherein the exposing is performed such that the surface of the object is positioned adjacent to a magnetic field vector maximum.

19. The method of claim 1, wherein the exposing comprises exposing the surface in a plurality of plasma bursts.

20. The method of claim 1, wherein the exposing is in a substantially single-mode cavity.

21. The method of claim 1, wherein the plasma catalyst is an active plasma catalyst.

22. The method of claim 1, wherein the directing comprises modulating the plasma.

23. A method of decrystallizing a surface of an object comprising:

initiating a microwave plasma at substantially atmospheric conditions;

exposing the surface to the plasma for a period of time sufficient to at least partially decrystallize the surface; and directing a laser beam at the surface during the exposing.

24. A method of decrystallizing a surface of an object comprising:

initiating a microwave plasma at substantially atmospheric conditions;

exposing the surface to the plasma for a period of time sufficient to at least partially decrystallize the surface;

wherein the exposing is performed such that the surface of the object is positioned adjacent to a magnetic field vector maximum; and wherein the vector maximum has a direction that is substantially perpendicular to the surface.

25. A method of decrystallizing a surface of an object comprising:

initiating a microwave plasma at substantially atmospheric conditions;

exposing the surface to the plasma for a period of time sufficient to at least partially decrystallize the surface;

wherein the object is a ceramic.

26. A method of decrystallizing a surface of an object comprising:

initiating a microwave plasma at substantially atmospheric conditions;

exposing the surface to the plasma for a period of time sufficient to at least partially decrystallize the surface; and wherein the object is composed of tungsten carbide.

27. A method of decrystallizing a surface of an object comprising:

initiating a microwave plasma at substantially atmospheric conditions;

exposing the surface to the plasma for a period of time sufficient to at least partially decrystallize the surface;

wherein the exposing is at a location, the method further comprising moving the surface relative to the location by a moving method selected from a group consisting of periodically moving, continuously moving, programmed moving, and any combination thereof; and wherein the object is a ceramic.

28. The method of claim 27, further comprising the step of shaping the ceramic before the exposing.

29. The method of claim 27, wherein the ceramic is composed of tungsten carbide.

* * * * *

UNITED STATES PATENT AND TRADEMARK OFFICE
CERTIFICATE OF CORRECTION

PATENT NO. : 7,214,280 B2  Page 1 of 1
APPLICATION NO. : 10/430416
DATED : May 8, 2007
INVENTOR(S) : Devendra Kumar It is certified that error appears in the above-identified patent and that said Letters Patent is hereby corrected as shown below:

Column 13, line 40, "plasma-assistedignition" should read --plasma-assisted ignition--; and Column 20, claim 8, line 36, "claim 6," should read --claim 7,--.

Signed and Sealed this

Eighth Day of April, 2008

JON W. DUDAS
*Director of the United States Patent and Trademark Office*